US012755231B2

(12) United States Patent
Bhambhani et al.

(10) Patent No.: US 12,755,231 B2
(45) **Date of Patent: *Oct. 6, 2026**

(54) MACHINE LEARNING METHOD AND SYSTEM FOR PREDICTING KEY AGRICULTURAL FIELD MANAGEMENT PRACTICES

(71) Applicant: CIBO Technologies, Inc., St Louis Park, MN (US)

(72) Inventors: Pankaj C. Bhambhani, Boston, MA (US); Ernesto Brau, Newton, MA (US)

(73) Assignee: CIBO Technologies, Inc., St. Louis Park, MN (US)

(*) Notice: Subject to any disclaimer, the term of this patent is extended or adjusted under 35 U.S.C. 154(b) by 0 days.

This patent is subject to a terminal disclaimer.

(21) Appl. No.: 18/649,970

(22) Filed: Apr. 29, 2024

(65) Prior Publication Data

US 2024/0362570 A1 Oct. 31, 2024

Related U.S. Application Data

(60) Provisional application No. 63/462,861, filed on Apr. 28, 2023.

(51) Int. Cl.
*G06F 30/27* (2020.01)
*G06N 7/01* (2023.01)
(Continued)

(52) U.S. Cl.
CPC ............... *G06F 30/27* (2020.01); *G06N 7/01* (2023.01); *G06Q 10/06312* (2013.01);
(Continued)

(58) Field of Classification Search
CPC .... G06F 30/27; G06N 7/01; G06Q 10/06312; G06Q 10/06375; G06Q 30/018; G06Q 30/0207; G06Q 50/02
(Continued)

(56) References Cited

U.S. PATENT DOCUMENTS

| | | | | |
|---|---|---|---|---|
| 7,904,332 | B1 * | 3/2011 | Merkley, Jr. | G06Q 30/0215 705/14.1 |
| 10,188,037 | B2 | 1/2019 | Bruns et al. | |

(Continued)

FOREIGN PATENT DOCUMENTS

| | | | |
|---|---|---|---|
| CN | 109389049 A * | 2/2019 | G06F 18/24 |
| CN | 113933896 | 1/2022 | |

(Continued)

OTHER PUBLICATIONS

Ellis, Rory. "Using Bayesian Growth Models to Predict Grape Yield." University of Canterbury. Published Sep. 12, 2021. Retrieved from https://ir.canterbury.ac.nz/server/api/core/bitstreams/298e6133-d5bd-4e2f-bf85-171a0ffb7db4/content on Jul. 24, 2025. pp. 1-185.

(Continued)

*Primary Examiner* — Abdallah A El-Hage Hassan
(74) *Attorney, Agent, or Firm* — Richard K. Huffman; Huffman Patent Group, LLC

(57) ABSTRACT

A computer-implemented method for predicting agricultural management practices, includes: generating a training dataset that comprises a plurality of years of known management practices associated with a plurality of fields dispersed within geographic region along with a corresponding plurality of years of first remote sense images; training a Bayesian crop model to predict the plurality of years of known management practices associated with the plurality of fields using the corresponding plurality of years of first remote sense images as inputs; providing a time series of second remote sense images associated with a corresponding field having unknown management practices as exclusive inputs to the Bayesian crop model; and executing the Bayesian crop model to predict a key management practices for the corresponding field.

20 Claims, 15 Drawing Sheets

(51) Int. Cl.
*G06Q 10/0631* (2023.01)
*G06Q 10/0637* (2023.01)
*G06Q 30/018* (2023.01)
*G06Q 30/0207* (2023.01)
*G06Q 50/02* (2024.01)

(52) U.S. Cl.
CPC ..... *G06Q 10/06375* (2013.01); *G06Q 30/018* (2013.01); *G06Q 30/0207* (2013.01); *G06Q 50/02* (2013.01)

(58) Field of Classification Search
USPC ......................................................... 705/7.37
See application file for complete search history.

(56) References Cited

U.S. PATENT DOCUMENTS

| | | | | |
|---|---|---|---|---|
| 10,684,612 | B2 | 6/2020 | Terres et al. | |
| 11,122,734 | B1 | 9/2021 | Guan et al. | |
| 11,263,707 | B2 | 3/2022 | Perry et al. | |
| 11,604,626 | B1 * | 3/2023 | Sawant | G06F 8/75 |
| 11,861,520 | B2 | 1/2024 | Elkin et al. | |
| 2017/0124463 | A1 | 5/2017 | Chen et al. | |
| 2018/0075546 | A1 | 3/2018 | Richt | |
| 2019/0050948 | A1 * | 2/2019 | Perry | G06Q 50/02 |
| 2019/0080246 | A1 | 3/2019 | Sun | |
| 2019/0228477 | A1 | 7/2019 | Carter et al. | |
| 2020/0019884 | A1 * | 1/2020 | McCourt, Jr. | G06N 20/00 |
| 2020/0258205 | A1 | 8/2020 | Allan et al. | |
| 2021/0065033 | A1 * | 3/2021 | Kunde | G06N 20/00 |
| 2021/0209490 | A1 | 7/2021 | Casas et al. | |
| 2022/0061236 | A1 | 3/2022 | Guan et al. | |
| 2022/0066456 | A1 | 3/2022 | Ebrahimi Afrouzi et al. | |
| 2022/0121919 | A1 * | 4/2022 | Yuan | G06N 3/08 |
| 2022/0138869 | A1 * | 5/2022 | Moghimi | G06Q 50/02 705/7.28 |
| 2022/0188693 | A1 * | 6/2022 | Tommasi | G06N 5/022 |
| 2022/0192099 | A1 | 6/2022 | Baurer et al. | |
| 2022/0240432 | A1 | 8/2022 | Acedo et al. | |
| 2022/0301080 | A1 | 9/2022 | Catala Luque et al. | |
| 2022/0383046 | A1 * | 12/2022 | Brau | G06N 3/09 |
| 2022/0383050 | A1 * | 12/2022 | Brau | G06N 3/084 |
| 2022/0383097 | A1 * | 12/2022 | Brau | G06V 20/188 |
| 2023/0017695 | A1 * | 1/2023 | Phillip | G06N 7/01 |
| 2023/0078852 | A1 | 3/2023 | Campbell et al. | |
| 2023/0316116 | A1 * | 10/2023 | Elkin | G06N 3/0442 |
| 2025/0285413 | A1 * | 9/2025 | Shu | G06F 16/29 |

FOREIGN PATENT DOCUMENTS

| | | | |
|---|---|---|---|
| WO | 2019032648 | 2/2019 | |
| WO | WO-2020055950 A1 * | 3/2020 | A01C 21/00 |

OTHER PUBLICATIONS

Zhang, Lifu et al. "Crop Classification Based on the Spectrotemporal Signature Derived from Vegetation Indices and Accumulated Temperature." International Journal of Digital Earth, 15:1, Mar. 8, 2022. pp. 626-652. https://doi.org/10.1080/17538947.2022.2036832.

CIBO, "Deliver High Impact Regenerative Agriculture Programs with CIBO." Apr. 2, 2023. Https://web.archive.org/web/20230402023121/https://www.cibotechnologies.com/ (Year: 2023). pp. 1-2.

Brau, Ernesto. "Regenerative Ag Verification 101 Pathway: Computer Vision and Remote Sensing: Agricultural Information in the 21st Century." CIBO Archives org. Feb. 9, 2023. pp. 1-6.

CIBO, "Proprietary Technology Reveals New Knowledge About Land." Apr. 22, 2021. https://web.archive.org/web/20210422014809/https://www.cibotechnologies.com/technology/ (Year: 2021). pp. 1-3.

Bhambhani, Pankaj. "Regenerative Ag Verification 101 Pathway: How Remotely Sensed Performance Zone Maps Improve Agriculture Assessments." CIBO. Feb. 9, 2023. https://web.archive.org/web/20230209023542/https://www.cibotechnologies.com/pathway/how-remotely-sensed-performance-zone-maps-improve-agriculture-assessments/ (Year: 2023) pp. 1-8.

Brau, Ernesto. "Regenerative Ag Verification 101 Pathway: Computer Vision and Remote Sensing: Agricultural Information in the 21st Century." CIBO https:web/archive.org/weg/20210916102843/https://www.cibotechnologiescom/pathway/computervision-and-remote-sensing-agricultural-information-in-the-21st-century/ (Year:2021). Feb. 16, 2021. pp. 1-5.

Tuttle, Tristrum. "ScalaStan and EvilPlot: Bayesian Statistics Meets Combinator-based Visualization!" CIBO webpages. May 10, 2018. https://www.cibotechnologies.com/blog/scalastan-and-evilplot-bayesian-statistics-meets-combinatorbased-visualization/ (Year: 2018) pp. 1-7.

Jiang, Pingping et al. "Bayesian Analysis of Within-Field Variability of Corn Yield Using a Spatial Hierarchical Model." Precision Agric (2009) 10:111-127. Published online Jul. 9, 2008. (Year: 2008).

Mouret, Florian et al. "Reconstruction of Sentinel-2 Derived Time Series Using Robust Gaussian Mixture Models—Application to the Detection of Anomalous Crop Development." Computers and Electronics in Agriculture 198 (2022) 106983. Available online May 6, 2022. pp. 1-14.

* cited by examiner

METHOD FOR GROWER INCENTIVE PROGRAM

REMOTE SENSE DATA CLEANSING AND FORMATTING FLOW

PERIODIC REMOTE SENSE DATA PROCESSING TO DETERMINE COMPLIANCE

CROP MODEL PROCESS WITH PLANTING DATE EXTENSION

EXEMPLARY INCENTIVE PROGRAM OFFER DISPLAY

1200

EXEMPLARY DETAILED INCENTIVE PROGRAM COMPARISON DISPLAY 1300

EXEMPLARY FIELD INCENTIVE PROGRAM ENROLLMENT DISPLAY

EXEMPLARY MANAGEMENT PRACTICES PROGRESS DISPLAY

1500

MACHINE LEARNING METHOD AND SYSTEM FOR PREDICTING KEY AGRICULTURAL FIELD MANAGEMENT PRACTICES

RELATED APPLICATIONS

This application claims the benefit of the following U.S. Provisional Applications, each of which is herein incorporated by reference in its entirety.

| Ser. No. | FILING DATE | TITLE |
|---|---|---|
| 63/462,861 (CIBO.2013P) | Apr. 28, 2023 | BAYESCROP: REMOTE-SENSING-BASED CROP IDENTIFICATION AND PLANTING DATE ESTIMATION |

This application is related to the following co-pending U.S. Patent Applications, each of which has a common assignee and common inventors, the entireties of which are herein incorporated by reference.

| Ser. No. | FILING DATE | TITLE |
|---|---|---|
| 18/649,808 (CIBO.2019) | Apr. 29, 2024 | MACHINE LEARNING METHOD AND SYSTEM FOR PREDICTING CROP TYPE |
| 18/649,834 (CIBO.2020) | Apr. 29, 2024 | MACHINE LEARNING METHOD AND SYSTEM FOR PREDICTING CROP TYPE AND PLANTING DATE |
| 18/649,935 (CIBO.2021) | Apr. 29, 2024 | MACHINE LEARNING METHOD AND SYSTEM FOR ESTIMATING AGRICULTURAL FIELD MANAGEMENT PRACTICES |
| 18/649,951 (CIBO.2022) | Apr. 29, 2024 | BAYESIAN METHOD AND SYSTEM FOR ESTIMATING KEY AGRICULTURAL FIELD MANAGEMENT PRACTICES |

BACKGROUND OF THE INVENTION

Field of the Invention

This invention relates in general to the field of agricultural modeling and related applications, and more particularly to computer vision and machine learning methods and systems for estimating agricultural management practices based exclusively on remote sense imagery.

Description of the Related Art

The identification of agricultural management practices, such as crop type, irrigation, planting dates, and harvest dates, has many applications, including land cover mapping, yield estimation, and natural resource monitoring. Advances in remote sensing have allowed for the identification of agricultural management practices across large regions of the continental US, but scarcity of ground truth data limits the accuracy and scalability of present-day remote sensing models.

Estimation of crop management practices, such as the crop type and the planting date, is vital to many natural, socio-economic, and scientific applications. For instance, in the Midwestern US, 75% of cropland (~95 million acres) is dedicated to growing corn and soybeans. Identification of these crops is important for land cover monitoring, commodity trading, crop yield estimation, natural resource monitoring, and studying the effect of agricultural on environment and climate change, among other applications.

Estimating planting/sowing date is similarly important. For instance, late planting has been associated with decreased crop yield in many regions of the world, including the Midwest. As one skilled in the art will appreciate, planting date is also a key parameter in mechanistic crop models that predict yield estimates. This is in part because planting date can be used to estimate the weather experienced by a crop during its growth stage and hence the final yield. Additionally, yield estimation and crop management require monitoring of crop progress at regional scales.

The present inventors have observed that a number of the above-noted applications require information at a large spatial extent and/or a fine spatial resolution. For instance, to study land cover change across the continental United States (or even the Midwest), information about crop planting history throughout the region is needed for multiple years. Similarly, applications such as precision agricultural management require crop identification at a sub-field level. However, for anything other than small geographical regions, such as a town or a county, collecting information by surveying individual fields is infeasible on the scale of several counties or a state.

Consequently, researchers have relied on remotely sensed data combined with automated methods to identify management practices. Unfortunately, the currently available automated methods are still ad-hoc and specific to the geographical region being tested and are hard to reliably scale across a region as large as the Midwest. A key reason for this is not having vast amounts of ground truth survey data to verify the accuracy of these methods at large scales. A common alternative for the US is to use data products provided by the US Department of Agriculture (USDA), the two main ones being Cropland Data Layer (CDL) and the planting date progress reports provided by National Agricultural Statistics Service (NASS). CDL is a yearly raster of land-use types covering the entire US, and while it is known to be accurate for corn and soybeans, is less reliable for other crops. NASS progress reports provide weekly planting estimates for each state, aggregated at the state level.

Machine learning methods have been a popular approach to classify vegetation using satellite imagery. The earliest techniques employed were rule-based methods such as decision trees or maximum likelihood classifiers. These methods typically involved heuristics derived from expert knowledge. Although the models were intuitive, they often worked well for only a limited geographical region and did not generalize well across multiple counties or states. More recently, deep learning methods have become attractive with the availability of higher-resolution imagery and powerful GPU. However, as one skilled in the art will appreciate, deep learning models require significantly more annotated data to be trained, especially if they are to be trained from scratch. This is economically infeasible, even if growers were willing to share this data. While it is possible to train on smaller datasets using transfer learning, the present inventors have noted that there are not any publicly available deep learning models trained on satellite imagery that have proven to be reliable and that may be adopted for crop identification.

To analyze trends at field-level and across large geographic regions, what is needed are methods and systems comprising crop models that can produce accurate estimates at these scales and resolutions using the small set of ground truth data available.

What is also needed is a statistical crop model which addresses the challenge of generating reliable management practice estimates at both a large spatial scale and a fine spatial resolution using a limited set of ground truth survey data.

What is further needed are methods and systems comprising a generative approach to modeling the crop growth in a field, based on expert knowledge of the visual evolution of a crop in a field, known as the crop's growth curve.

What is moreover needed are techniques that utilize a Bayesian model, which means the above knowledge is encoded in a prior distribution, and which allows producing accurate results with a relatively small set of input training data.

SUMMARY OF THE INVENTION

The present invention, among other applications, is directed to solving the above-noted problems and addresses other problems, disadvantages, and limitations of the prior art by providing accurate and reliable techniques for estimating agricultural management practices at scale.

In one embodiment, a computer-implemented method for predicting agricultural management practices is provided, the method including: generating a training dataset that includes a plurality of years of known management practices associated with a plurality of fields dispersed within geographic region along with a corresponding plurality of years of first remote sense images; training a Bayesian crop model to predict the plurality of years of known management practices associated with the plurality of fields using the corresponding plurality of years of first remote sense images as inputs; providing a time series of second remote sense images associated with a corresponding field having unknown management practices as exclusive inputs to the Bayesian crop model; and executing the Bayesian crop model to predict a crop type, a planting date, an emergence date, a senescence start date, and a harvest date for the corresponding field.

One aspect of the present invention contemplates a non-transitory computer-readable storage medium storing instructions that, when executed by a computer, cause the computer to perform a method for predicting agricultural management practices, the method including: generating a training dataset that includes a plurality of years of known management practices associated with a plurality of fields dispersed within geographic region along with a corresponding plurality of years of first remote sense images; training a Bayesian crop model to predict the plurality of years of known management practices associated with the plurality of fields using the corresponding plurality of years of first remote sense images as inputs; providing a time series of second remote sense images associated with a corresponding field having unknown management practices as exclusive inputs to the Bayesian crop model; and executing the Bayesian crop model to predict a crop type, a planting date, an emergence date, a senescence start date, and a harvest date for the corresponding field.

Another aspect of the present invention envisages a system for predicting agricultural management practices, the system including: an incentive program server, the server including: a crop model processor, including a Bayesian crop model; a training processor, configured to: generate a training dataset that includes a plurality of years of known management practices associated with a plurality of fields dispersed within geographic region along with a corresponding plurality of years of first remote sense images; and train the Bayesian crop model to predict the plurality of years of known management practices associated with the plurality of fields using the corresponding plurality of years of first remote sense images as inputs; a remote sense processor, configured to provide a time series of second remote sense images associated with a corresponding field having unknown management practices as exclusive inputs to the Bayesian crop model within the crop model processor; and the crop model processor, configured to execute the Bayesian crop model to predict a crop type, a planting date, an emergence date, a senescence start date, and a harvest date for the corresponding field.

BRIEF DESCRIPTION OF THE DRAWINGS

These and other objects, features, and advantages of the present invention will become better understood with regard to the following description, and accompanying drawings where.

DETAILED DESCRIPTION

Figure 1:
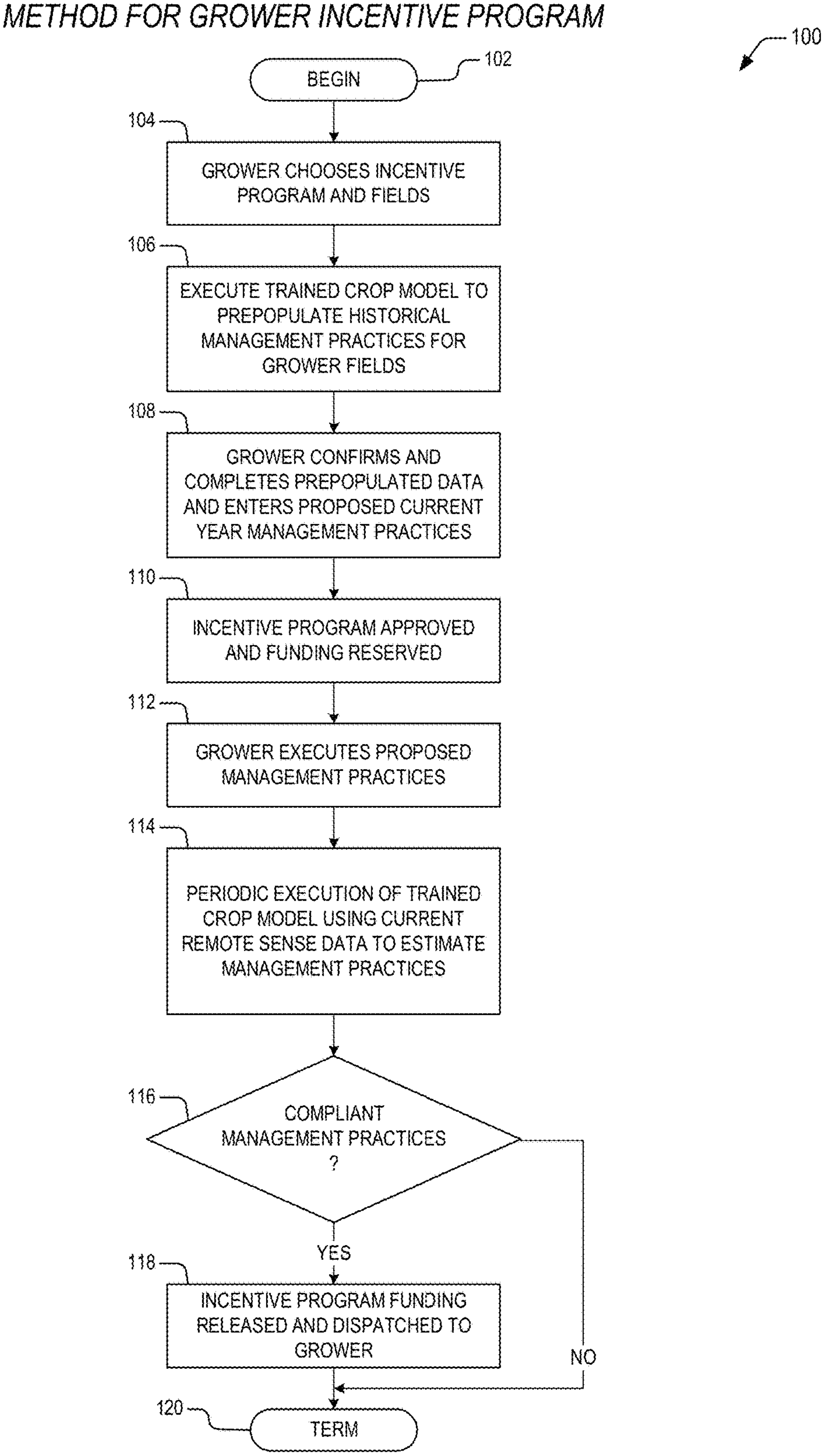
FIG. 1 is a flow diagram illustrating a method for implementing and executing a grower incentive program according to an exemplary embodiment of the present invention.

Exemplary and illustrative embodiments of the invention are described below. It should be understood at the outset that although exemplary embodiments are illustrated in the figures and described below, the principles of the present disclosure may be implemented using any number of techniques, whether currently known or not. In the interest of clarity, not all features of an actual implementation are described in this specification, for those skilled in the art will appreciate that in the development of any such actual embodiment, numerous implementation specific decisions are made to achieve specific goals, such as compliance with system-related and business-related constraints, which vary from one implementation to another. Furthermore, it will be appreciated that such a development effort might be complex and time-consuming, but would nevertheless be a routine undertaking for those of ordinary skill in the art having the benefit of this disclosure. Various modifications to the preferred embodiment will be apparent to those skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The present invention will now be described with reference to the attached figures. Various structures, systems, and devices are schematically depicted in the drawings for purposes of explanation only and so as to not obscure the present invention with details that are well known to those skilled in the art. Nevertheless, the attached drawings are included to describe and explain illustrative examples of the present invention. Unless otherwise specifically noted, articles depicted in the drawings are not necessarily drawn to scale.

The words and phrases used herein should be understood and interpreted to have a meaning consistent with the understanding of those words and phrases by those skilled in the relevant art. No special definition of a term or phrase (i.e., a definition that is different from the ordinary and customary meaning as understood by those skilled in the art) is intended to be implied by consistent usage of the term or phrase herein. To the extent that a term or phrase is intended to have a special meaning (i.e., a meaning other than that understood by skilled artisans) such a special definition will be expressly set forth in the specification in a definitional manner that directly and unequivocally provides the special definition for the term or phrase. As used in this disclosure, "each" refers to each member of a set, each member of a subset, each member of a group, each member of a portion, each member of a part, etc.

Applicants note that unless the words "means for" or "step for" are explicitly used in a particular claim, it is not intended that any of the appended claims or claim elements are recited in such a manner as to invoke 35 U.S.C. § 112 (f).

Definitions

Central Processing Unit (CPU): The electronic circuits (i.e., "hardware") that execute the instructions of a computer program (also known as a "computer application," "application," "application program," "app," "computer program," or "program") by performing operations on data, where the operations may include arithmetic operations, logical operations, or input/output operations.

Processor: An electronic device that functions as a CPU on a single integrated circuit. A microprocessor receives digital data as input, processes the data according to operating system and application program instructions fetched from a memory, and generates results of operations prescribed by the instructions as output.

Server: A server is a computer or system that provides resources, data, services, or programs to other computers, known as clients, over a network. A server may perform a single task, such as a mail server, which accepts and stores email and then provides it to a requesting client. Servers may also perform several tasks, such as a file and print server, which both stores files and accepts print jobs from clients and then sends them on to a network-attached printer.

Module: As used herein, the term "module" may refer to, be part of, or include an application specific integrated circuit (ASIC), an electronic circuit, a processor (shared, dedicated, or group) and/or memory (shared, dedicated, or group) that execute one or more computer programs, a combinational logic circuit, and/or other suitable components that provide the described functionality.

Integrated Circuit (IC): A set of electronic circuits fabricated on a small piece of semiconductor material, typically silicon. An IC is also referred to as a chip, a microchip, or a die.

Internet: The Internet is a global wide area network connecting computers throughout the world via a plurality of high-bandwidth data links which are collectively known as the Internet backbone. The Internet backbone may be coupled to Internet hubs that route data to other locations, such as web servers and Internet Service Providers (ISPs). The ISPs route data between individual computers and the Internet and may employ a variety of links to couple to the individual computers including, but not limited to, cable, DSL, fiber, and Wi-Fi to enable the individual computers to transmit and receive data over in the form of email, web page services, social media, etc. The Internet may also be referred to as the world-wide web or merely the web.

Greenhouse Gases: The different gases that cause the "greenhouse effect" in Earth's atmosphere, basically causing light from the sun to be trapped as heat. The most important gases to consider for row crop agriculture are carbon dioxide (CO2) and nitrous oxide (N2O).

Greenhouse Gas Emissions: The various human activities that emit, or release, greenhouse gases into the air. For example, driving a car burns fossil fuels which releases CO2 as a byproduct. In agricultural parcels, emissions occur directly from the soil as a result of soil management, from performing necessary farming activities (e.g., driving tractors, which burn fossil fuels, releasing CO2), and from manufacturing nitrogen fertilizer (which also burns fossil fuels, releasing CO2).

Carbon Sequestration: The amount of additional carbon is retained in the soil. In some cases, the amount of carbon in the soil increases over time and such is referred to as the amount of carbon that is being sequestered. If the amount of carbon in the soil is decreasing over time (i.e., being released into the atmosphere as CO2), then such is referred to as a greenhouse gas emission. In any given calculation for a field, carbon is either being sequestered or emitted.

CO2e (or CO2E): A single number representing the greenhouse gas impact of the different gasses forming the greenhouse effect, where gases other than CO2 are converted into carbon dioxide equivalents using standard conversion techniques prescribed by the Intergovernmental Panel on Climate Change (IPCC) that are based on the effects of each of the gasses in the atmosphere.

Carbon Footprint: A single number expressed in CO2e that represents the aggregation of both greenhouse gas emissions and carbon sequestration occurring in a single field (or prescribed region, etc.). Since both greenhouse gas emissions and carbon sequestration may be converted to $CO_2e$, a field's net total greenhouse gas emissions (i.e., greenhouse gas emissions minus carbon sequestration) is referred to as it's carbon footprint.

In view of the above background discussion on how agricultural management practices are modeled, how implementation of those practices is tracked, and the disadvantages and limitations associated with these present-day techniques, a discussion of the present invention will be provided with reference to FIGS. 1-14. The present invention overcomes the problems associated with present-day techniques by providing automated methods and systems directed toward predicting and determining agricultural management practices including, but not limited to, crop type ("crop ID"), planting date, emergence date, senescence start date, and harvest date via exclusive employment of remote sense image data. These automated methods and systems may also be employed according to exemplary embodiments of the present invention to monitor and verify compliance with one or more management practices requirements associated with one or more grower incentive programs.

Referring to FIG. 1, a flow diagram 100 is presented illustrating a method for implementing and executing a grower incentive program according to an exemplary and practical embodiment of the present invention. As a background for understanding the method employed, the present inventors note that there are many different types of grower incentive programs in practice today, many of which are funded by the U.S. Department of Agriculture and many of which are privately funded by, for example, consumer goods producers (CGP's). Though their funding sources differ, what these programs provide are cash incentives to farmers who contract through one or more incentive programs that require implementation and execution of certain agricultural management practices such as, but not limited to, crop type (both cash crop and cover crop), specific cultivar or crop variety, planting date, harvest date, planting density (i.e., seeds per acre and row spacing), tillage types and dates, fertilizer application (e.g., types, dates, and amounts), crop rotation dates, irrigation (e.g., dates and amounts), buffer zoning, and drainage control.

In addition to enrolling one or more fields in an incentive program, the grower is required to provide location and geometries of their fields along with years of historical field management practice data, which is often entered by agronomists, but which is nevertheless an onerous task. Once enrolled, implementation of the management practices under contract requires that the fields be monitored and verified for initial, interim, and final compliance with incentive program requirements. Presently, this monitoring and verification is performed by humans. In addition to being labor intensive, compliance monitoring/verification requires burdensome interactions with the grower.

It is an object of the present invention to utilize advanced computer vision techniques to automate numerous task that require identification of crop type, planting date harvest date, and other management practices for both historical and current field practices, thus markedly decreasing or fully eliminating the need to employ utilize human capital in the program enrollment, compliance monitoring, and compliance verification processes. These computer vision techniques, described in more detail hereinbelow, process historical and current satellite images ("remote sense data") of fields to perform the enrollment, monitoring, and verification functions. Image processing may include image data cleansing and formatting, transformation of multiple images at different wavelength into composite vegetation indices and processing a time series of composite vegetation indices using machine learning (ML) Bayesian modeling techniques to determine and/or predict agricultural management practices for fields that are to be enrolled or that are already enrolled in one or more grower incentive programs.

At block 102, one or more grower incentive offers are presented to a grower. Flow then proceeds to block 104.

At block 104, the grower selects one or more fields to participate in one or more of the incentive offers. Flow then proceeds to block 106.

At block 106, a trained ML Bayesian crop model according to the present invention is executed using historical field data to determine historical management practices employed by the grower for one or more years prior to enrollment. In one embodiment, the number of prior years is 10 years. The model may exclusively employ remote sense images for those field years to estimate the historical management practices. Once determined, these management practices are used to prepopulate incentive program enrollment applications (typically electronic applications) that are required for the grower's fields to participate. Flow then proceeds to block 108.

At block 108, the grower reviews, confirms, and completes the enrollment applications and commits to implementing and executing management practices required by the one or more incentive programs. Flow then proceeds to block 110.

At block 110, administrators of the incentive programs approve the enrollment applications and further reserve funding (incentives) for payment to the grower, contingent on verification of the grower's compliance in implementing the required management practices. Flow then proceeds to block 112.

At block 112, the grower initiates execution of the requirement management practices on the one or more fields. Flow then proceeds to block 114.

At block 114, the crop model is periodically executed using current remote sense images in order to predict the required management practices in order to determine interim compliance and subsequently to verify final compliance with program requirements. Each set of images is employed by the crop model to build a remote sense vegetation index over a period of time. Employing ML Bayesian techniques according to the present invention, the remote sense vegetation index is matched to a specific crop vegetation index double-sigmoid function that uniquely identifies crop type and that is employed by the model to estimate remaining management practices such as, but not limited to, planting date, emergence date, senescence start date, and harvest date. Execution of these management practices are marked by date as being compliant or non-compliant with program requirements. Flow then proceeds to decision block 116.

At decision block 116, an evaluation is made to verify that the grower's implementation and execution of the required management practices complies with overall incentive program requirements by processing the dated compliance/non-compliance metrics generated at block 114. If the grower's execution of overall program requirements is determined to be compliant, then flow proceeds to block 118. If the grower's execution of overall program requirements is non-compliant, then flow proceeds to block 120.

At block 118, electronic messages may be transmitted to the grower, the incentive program administrators, and/or third-party payors ("banks") to transfer payment for compliant participation in the one or more incentive programs. Preferably, transfer of the payment is accomplished via automated clearing house (ACH) electronic transfers, wire transfers, or online transfers upon dispatch of the messages; however, the messages may be in the form of a paper letter and the payment may be via paper check.

At block 120, the method completes.

Figure 2:
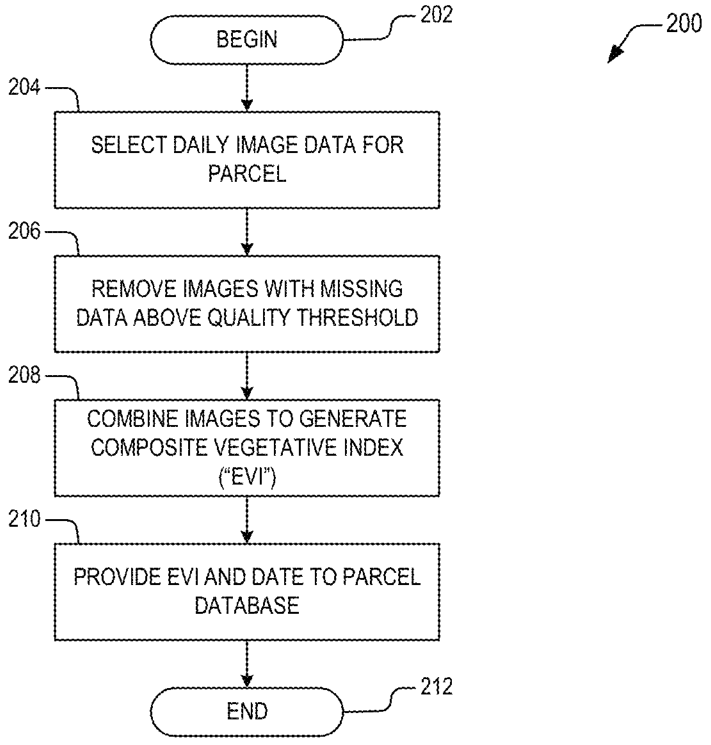
FIG. 2 is a flow diagram depicting a method according to the present invention for cleansing and formatting remote sense data.

Now referring to FIG. 2, a flow diagram 200 is presented depicting a method according to the present invention for cleansing and formatting remote sense data, such as the image data employed by the method of FIG. 1. Though the images may preferably comprise NASA Landsat and/or ESA Sentinel-2 satellite images, the present invention also contemplates the use of arial imagery. As one skilled in the art will appreciate, this remote sense data may comprise images at spectral bands commensurate with monitoring and implementation and execution of the aforementioned one or more management practices. One skilled will also appreciate that Landsat and Sentinel-2 satellite series are freely available and have global coverage. Preferably, Landsat Level-2 product from Landsat 7 is employed, which has a spatial resolution of 30 m and provides roughly one image per week starting from 1999. For Sentinel, level L2A product is employed, which yields 10 m resolution and one image per week from 2016-2017, and two images per week after 2017, when the second Sentinel-2 satellite was launched. Both of these products contain atmosphere-corrected surface reflectance, which are carefully calibrated by NASA and ESA, respectively. Both of these sources provide the spectral bands commensurate with monitoring and implementation and execution of the aforementioned one or more management practices, e.g., red, green, blue, near-infrared, etc. For more information, the reader is referred to the Landsat and Sentinel mission websites.

One skilled with further appreciate that a very common use of surface reflectance satellite data is generating spectral indices to monitor changes in the land surface. For vegetation, the two most widely-used indices include the Normalized Difference Vegetation Index (NDVI) and the Enhanced Vegetation Index (EVI), both of which measure the amount of "greenness" in a region at a given time which can be used as a proxy for biomass. In addition, EVI has been found to be more effective than NDVI for plant monitoring, as it minimizes canopy-soil variations and improves sensitivity over dense vegetation conditions, which is thus better-suited than NDVI for assessing the start of crop growing.

Once cleansed and formatted, EVI estimates for a field against the day of image capture is evaluated to see how EVI value changes as a crop grows during the season. This time series profile is called the EVI growth curve. Estimated EVI growth curves according to the present invention are matched to a specific crop vegetation index double-sigmoid function that uniquely identifies crop type and that is employed by the model to estimate remaining management practices such as, but not limited to, planting date, emergence date, senescence start date, and harvest date. A comparison of estimated EVI growth curves versus their corresponding double-sigmoid functions is discussed in more detail below with reference to FIG. 8.

Flow begins at block 202, where one or more dates are selected to obtain remote sense images in order to estimate an EVI growth curve for a particular field. Flow then proceeds to block 204

At block 204, remote sense images for the one or more dates are acquired by a system according to the present invention, typically by accessing public and/or commercial databases. As described above, the images are downloaded, assessed, cleansed, and stored. Flow then proceeds to block 206.

At block 206, images that have missing data (e.g., covered by clouds) above a prescribed quality threshold are removed and images with missing data below the prescribed quality threshold are retained. Some of the missing data in the retained images may be estimated by time-processing data from other time-adjacent images which include that data and using that data from the time-adjacent images to replace the missing data. Replacement methods may include, but are not limited to, absolute replacement, replacement via interpolation, replacement by extrapolation, etc. Flow then proceeds to block 208.

At block 208, relevant spectral bands for a given observation are combined to generate composite image for the field on that date according to well-known techniques. Ultimately, a time series of composite images are combined to create a remote sense composite EVI growth curve for that field. Flow then proceeds to block 210.

At block 210, the individual images, composite images, and remote sense composite EVI growth curve are stored in a field database. Flow then proceeds to block 212.

At block 212 the method completes.

Figure 3:
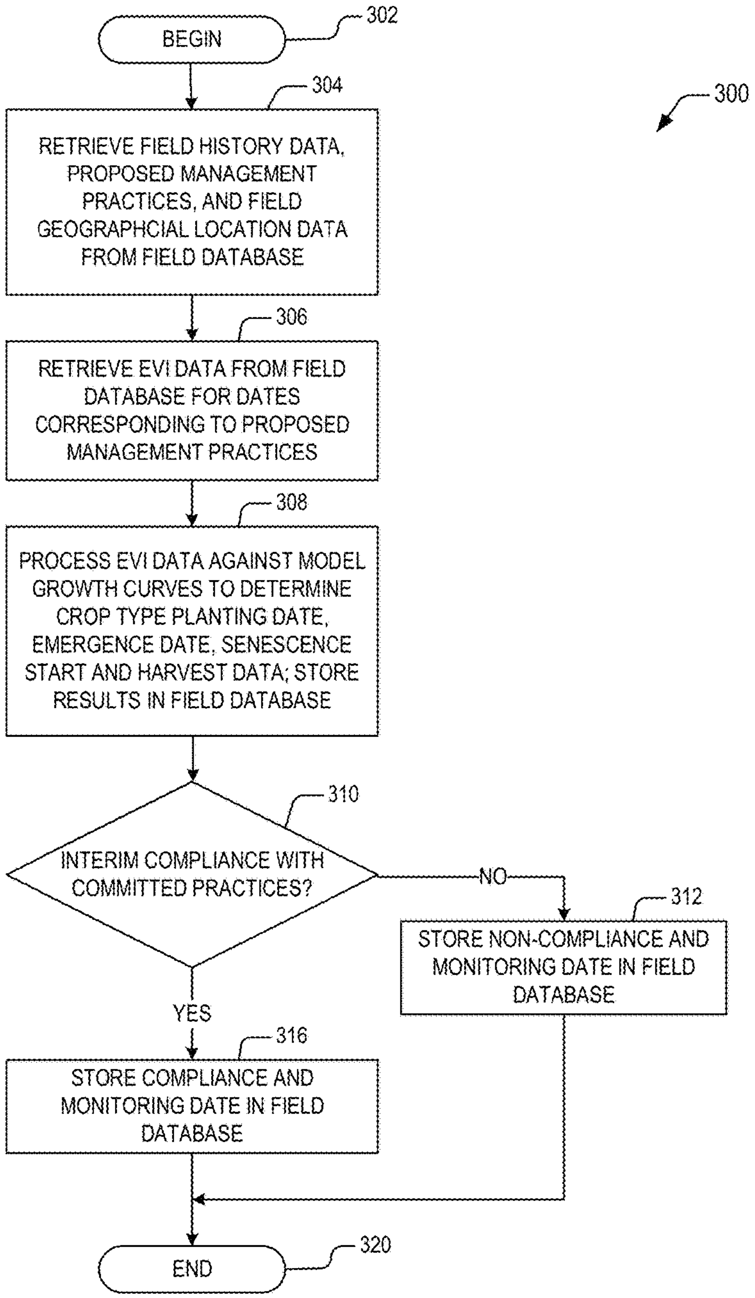
FIG. 3 is a flow diagram featuring an exemplary method for determining compliance with management practices prescribed by a grower incentive program, such as the program of FIG. 1.

Turning to FIG. 3, a flow diagram 300 is presented featuring an exemplary method for determining compliance with management practices prescribed by a grower incentive program, such as the program of FIG. 1. Once a grower has been approved for participation in a grower incentive program, periodic processing of remote sense images is required in order to estimate EVI growth curves for the grower's fields, from which interim compliance with program requirements is determined and from which verification of final compliance is determined. Flow begins at block 302 where periodic processing of remote sense image data is required. Flow then proceeds to block 304.

At block 304, historical field management practices, contracted management practices, and field geographical location data is retrieved from a field database within a grower incentive program system according to the present invention. Flow then proceeds to block 306.

At block 306, current remote sense composite EVI growth curves for the fields are retrieved from the field database within the system for those dates corresponding to contracted management practices for the grower's fields. Flow then proceeds to block 308.

At block 308, the remote sense growth curves are processed by a ML Bayesian crop growth model within the system to determine matches with corresponding scientific EVI growth curves and the remote sense growth curves are evaluated to determine management practices on the fields including crop/cultivar type, planting date, emergence data, senescence start date, and harvest date. As one skilled in the art will appreciate, scientific EVI growth curves for virtually all crop types and cultivars are well known and publicly available. An in-depth discussion of how the system according to the present invention matches remote sense curves with scientific curves, along with how these curves are evaluated to determine/predict management practices is provided below with reference to FIGS. 8-10. The determined management practices corresponding to remote sense data to date are stored in the field database. Flow then proceeds to decision block 310.

At decision block 310, the stored management practices are evaluated against incentive program requirements to determine if the grower is currently complying with the program requirements. If so, then flow proceeds to block 316. If not, then flow proceeds to block 312.

At block 312, monitoring date and an indication of non-compliance is stored in the field database. Flow then proceeds to block 320.

At block 316, monitoring date and an indication of compliance is stored in the field database. Flow then proceeds to block 320.

At block 320, the method completes.

Figure 4:
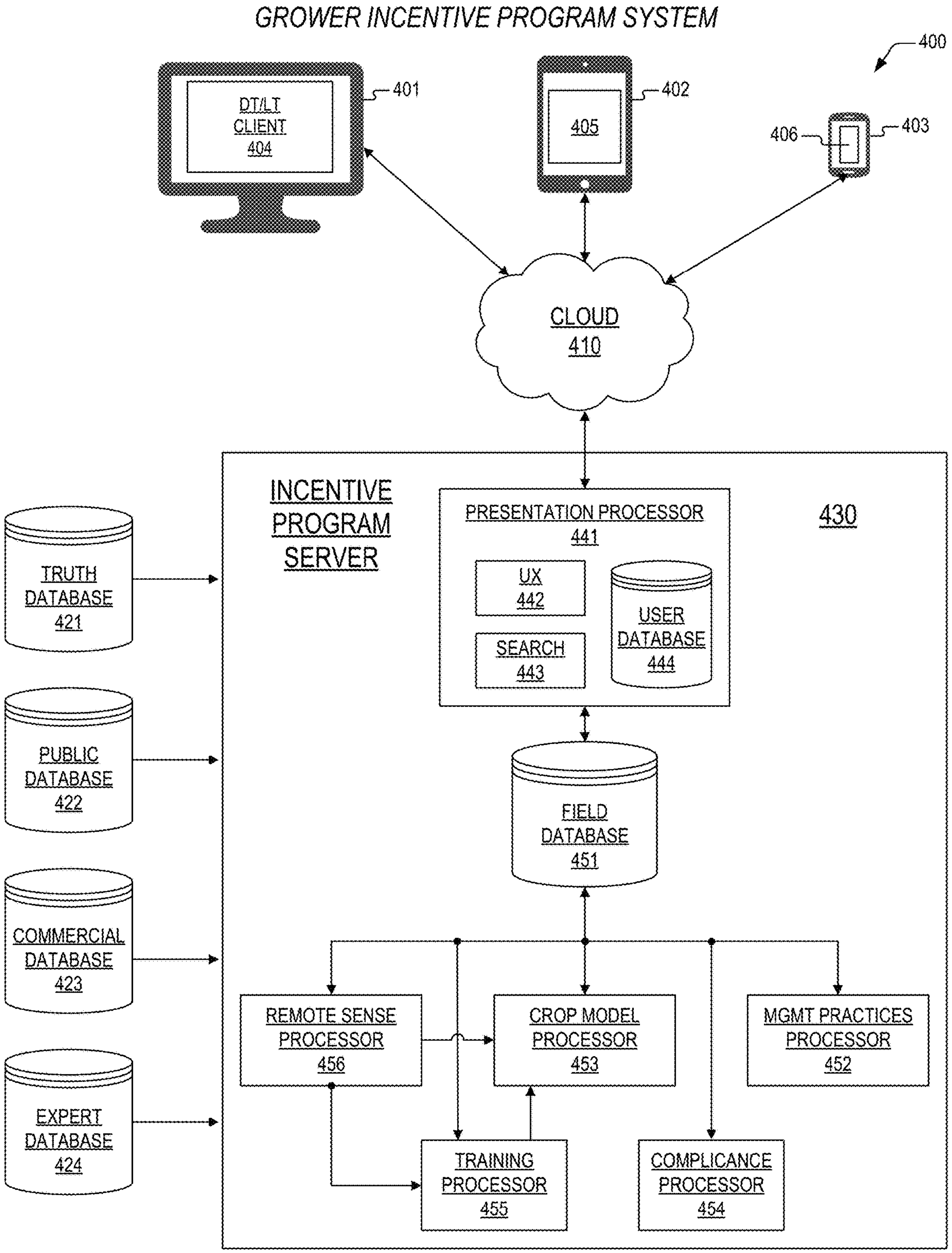
FIG. 4 is a block diagram showing a grower incentive program system according to the present invention.

Now turning to FIG. 4, a block diagram is presented showing a grower incentive program system 400 according to the present invention. The system 400 is configured to perform all of the steps discussed above with regard to the methods of FIGS. 1-3. The system 400 may include an incentive program server 430 that is coupled to one or more client devices 401-403 through the internet cloud 410. The client devices 401-403 may include one or more desktop/laptop computers 401 that execute desktop/laptop client applications 404 for communication and interaction with the incentive program server 430 through the internet cloud 410. The client devices 401-403 may also include one or more smart tablet computers 402 that execute tablet client applications 405 for communication and interaction with the incentive program server 430 through the internet cloud 410. The client devices 401-403 may further include one or more smartphone devices 403 that execute smartphone client applications 406 for communication and interaction with the server 430 through the internet cloud 410.

The incentive program server 430 may be coupled to a truth database 421, a public database 422, a commercial database 423, and an expert database 424. Though represented in the block diagram as single databases 421-424, each of the databases 421-424 may comprise a substantial number of databases through which the incentive program server 430 may access ground truth data, public data, commercial data, and expert scientific data in order to translate this data into remote sense EVI growth curves and implemented management practices for grower fields that are pending enrollment or currently enrolled in one or more grower incentive programs, as alluded to above.

Preferably, ground truth data includes data obtained directly from growers and may include "as applied" data corresponding to fertilizer application and field trial results, namely, the measurements taken by farming partners who plant and harvest crops under a wide range of specified scenarios. These field trial results are employed by the incentive program server 430 to train, test, and improve the accuracy and reliability of an ML Bayesian crop model therein that may be executed to generate the remote sense EVI growth curves, to match the remote sense curves with corresponding EVI growth curves obtained from the expert database 424, and to translate these remote sense curves into implementation and execution of required management practices, where such translations are employed to scale simulations from individual parcels to hundreds of thousands of parcels within geographic regions. An advantage of the system 400 according to the present invention is that the crop model is trained on ground truth data from a relatively small sample of fields within the various geographic regions.

Public data comprises a wide variety of sources such as, but not limited to, county records, United States Department of Agriculture reports; parcel geographic coordinates data and topography; soil types and layering (e.g., Soil Survey Geographic Database (SSURGO); historical crop planting, harvesting, and yield data; soil type indexes (e.g., Corn Stability Rating 2 (CSR2); historical and forecast weather data; and satellite and aerial image data taken across agriculturally meaningful spectral bands (e.g., Landsat, Sentinel) that may be processed by the incentive program server 430 to understand crop types, rotations, management practices (e.g., planting dates, tillage types and dates, fertilization types and dates, irrigation types and dates, harvesting dates), and stages of growth at any given time.

Commercial data may comprise any of the public data that is aggregated or formatted for ease of access by the incentive program server 430.

Expert data may comprise selected global scientific results taken from published literature. The results are provided to the incentive program server 430 to train and validate Bayesian crop simulations and to ensure that the simulations are accurate across a wide range of management scenarios and weather conditions. In one embodiment, crop simulation results are compared to scientific research data obtained under similar management practices and weather conditions.

The incentive program server 430 may include a presentation processor 441 that is coupled to a field database 451. The presentation processor 441 comprises a user interface (UX) component 442, a search engine component 443, and a user database 444.

The incentive program server 430 may further comprise a management practices processor 452, a crop model processor 453, a compliance processor 454, a training processor 455, and a remote sense processor 456, all of which are coupled to the field database 451. The training processor 455 is also coupled to the crop model processor 453 and to the remote sense processor 456. The remote sense processor 456 is additionally coupled to the crop model processor 453.

In operation, records corresponding to agricultural parcels in a prescribed region are created, iterated, and revised as a function of newly available data from one or more of the databases 421-424 and applicable results from recent crop simulations performed by the crop simulation processor 453. The records are stored in the field database 451 for access by management practices processor 452, the crop model processor 453, the compliance processor 454, the training processor 455, the remote sense processor 456, and the presentation processor 441. Users may execute the client applications 404-406 on the client devices 401-403 to specify search parameters for one or more field records stored within the field database 451 and to confirm/enter field historical management practices data corresponding enrollment in one or more grower incentive programs. The user interface processor 442 executes in order to transmit display and data entry windows to the client devices 401-403 via their respective client applications 404-406 to enable the users to specify the search parameters, to select incentive programs for participation, to confirm and complete historical field data associated with the incentive programs, and to commit to required management practices for those selected incentive programs. The client applications 404-406 may transmit the search parameters, selected incentive programs, historical field data, and commited management practices to the presentation processor 441 through the internet cloud 410. In one embodiment, the search parameters, selected incentive programs, historical field data, and committed management practices are stored in corresponding user records within the user database 444 to accelerate subsequent client-server sessions. Upon receipt of the search parameters, selected incentive programs, historical field data, and committed management practices, the search engine processor 443 employs the corresponding user records to access one or more records within the field database 451 that satisfy the search parameters, selected incentive programs, historical field data, and committed management practices. The one or more records within the field database 151 may also be stored in corresponding user records within the user database 444 to accelerate subsequent sessions, and the one or more records within the field database 451 that are provided by the search engine processor 443 to the user interface processor 442, which formats the one or more records for display by the client applications 404-406 on the client devices 401-403 according to device type, and the presentation processor 441 transmits the one or more records to the client devices 401-403 along with contextual metadata corresponding to the one or more fields (e.g., parcels shown on a map) that enable the users to visualize and better comprehend results of their searches.

In one embodiment, users may iteratively refine searches by specifying additional search and management practices parameters to further target fields that are of interest, and these results are additionally stored in the corresponding user records within the user database 444.

Upon selection of a specific field record, the presentation processor 441 may transmit fields within the records that are formatted by the user interface processor 442 for display to the user along with metadata that enable the user to visualize and comprehend the record fields associated with the parcel, thus providing the user with a substantially improved method for making an informed decision regarding participation in an incentive program.

The remote sense processor 456 may process satellite/aerial images, and may cleanse and format images, and estimate missing data as described above, and merge images from one or more spectral bands into composite images, which are employed by the crop model processor 453 to generate estimated vegetative indices. These estimated vegetative indices are employed by the management practices processor 452 to determine both historical and current management practices for fields associated with the processed remote sense images.

The management practices processor 452 may access data from the databases 421-424 corresponding to historical management practices associated with parcels and rank the outputs against other management practice data that is received from one or more of the databases 421-424. In turn, the management practices processor 452 may prepopulate incentive program enrollment applications where data are sparse or incomplete. For example, management practices from the truth database 121 may be ranked higher than public data, commercial data, or even crop simulation results for use in both populating enrollment applications and for use by the training processor 455 when training and retraining (updating) the ML Bayesian crop model within the crop model processor 453.

The training processor 455 operates to train the ML Bayesian crop model within the crop model processor 453 to predict management practices for fields within a given geographic region (e.g., corn belt), state, or the entire United States. Historical remote sense images for a number of field years are accessed and processed by the remote sense processor 456 and these images along with corresponding management practices for a sample of fields within a geographic region are employed by the training processor 455 to train the crop model. The corresponding management practices are accessed from the ground truth database 422, which comprises years of historical management practices provided by growers for the sample of fields. Thus, the crop model is trained using historical remote sense images for the sample of fields to predict the corresponding management practices provided as ground truth data. As will be discussed in more detail below, time series of the remote sense images for the sample of fields are employed by the crop model during training to construct predicted EVI curves that are evaluated the management practices processor 452 to predict the management practices for a number of field years for the sample of fields. The predicted management practices are compared with the management practices provide by the ground truth data, and model parameters are iteratively adjusted so that the model may be used to predict EVI curves within a specified error tolerance for fields that do not have ground truth data. In addition to initial training, the training processor with periodically retrain and improve the crop model when additional training data is available. For example, as growers are added to the ground truth database, retraining may occur when their additional ground truth data is available along with corresponding remote sense images.

Once the crop model is trained, the crop model processor 453 may process both historical and current remote sense images to initialize or add to remote sense EVI curves for specified fields. Via the trained crop model, these remote sense EVI curves are matched to corresponding expert EVI curves with a high level of accuracy and reliability, as will be described in further detail below. Both remote sense and expert EVI curve data is stored in and accessed from the field database 451.

In one embodiment, the crop simulation processor 453 preferably comprises a Bayesian statistical model that captures the causal relationship between crop type and planting date in a field and the observed remote sense images of that field, in the form of a growth curve, as discussed above, throughout the growing season. The following paragraphs gives a brief overview of some of these topics in preparation for a detailed discussion on the crop model/inference engine provided in subsequent paragraphs. As a notation convention, throughout the text Greek letters are employed to represent model parameters and boldfaced symbols to represent vectors.

As is noted above, the crop model employs imagery from two satellite sources: NASA's Landsat and ESA's Sentinel-2 satellite series, both of which are freely available and have global coverage. For Landsat, Level-2 product from Landsat 7 is used, which has a spatial resolution of 30 m and provides roughly one image per week starting from 1999. For Sentinel-2, L2A product is used, which has 10 m resolution and one image per week from 2016-2017, and two images per week after 2017, when the second Sentinel-2 satellite was launched. Both of these products contain atmosphere-corrected surface reflectance, which are carefully calibrated by NASA and ESA, respectively. Both of these sources provide the spectral bands used by the crop model.

A very common use of surface reflectance satellite data is generating spectral indices to monitor changes in the land surface. For vegetation, as noted above, the two most widely-used indices include the Normalized Difference Vegetation Index (NDVI) and the Enhanced Vegetation Index (EVI), both of which measure the amount of "greenness" in a region at a given time, which can be used as a proxy for biomass. As one skilled in the art will appreciate, EVI has been found to be more effective than NDVI for plant monitoring, as it minimizes canopy-soil variations and improves sensitivity over dense vegetation conditions.

Figure 8:
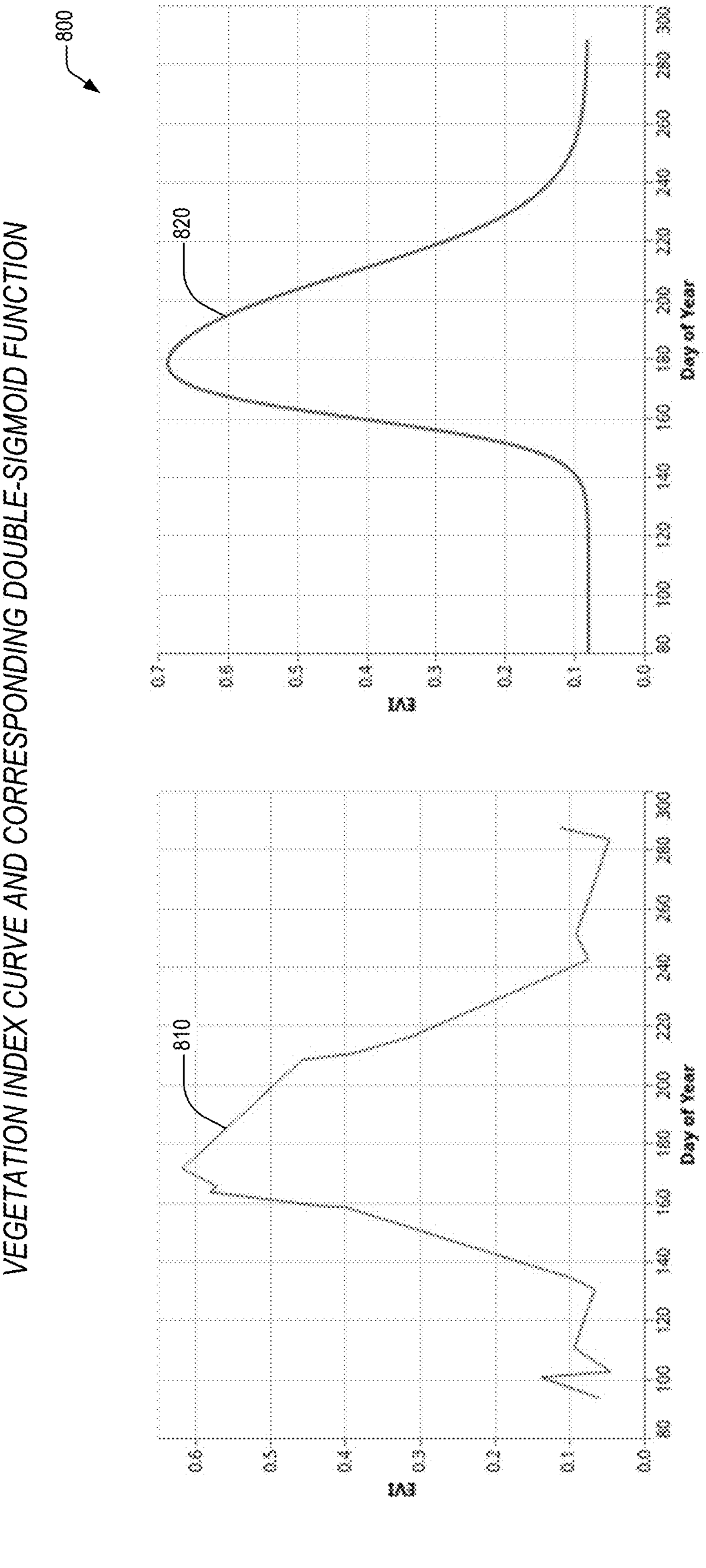
FIG. 8 is a diagram illustrating a vegetation index curve and its corresponding double-sigmoid function according to an exemplary embodiment of the present invention.

Operationally, the crop model processor 453 plots EVI estimates for a field against the day of image capture to see how the EVI value changes as the crop grows during the season. This time series profile is called an EVI growth curve. FIG. 8 shows an example of an estimated EVI growth curve 810. Note the rise in EVI during the main summer days followed by a drop in its value around the end of the summer.

FIG. 8 depicts a representative estimated EVI curve 810 and its corresponding double-sigmoid curve 820, which is generated using expert data. Curve 810 may comprise typical EVI growth curve for a corn field in the corn belt. The horizontal axis shows the day of year (DOY), and the vertical axis is the observed EVI value for each day there was a measurement (i.e., remote sense images), averaged over the pixels of the field. Curve 820 shows the matching corresponding curve approximated by the double-sigmoid function.

It is common to use a sigmoid-like function to model crop growth because the growth rate of a leaf is proportional to the amount of sunlight intercepted, and, since larger leaves (with more surface area) intercept more light, they grow faster, resulting in exponential growth. Eventually, the leaves at the top of the canopy prevent sunlight from reaching down, and the lower leaves start to senesce. This exponential accumulation of "greenness" is well approximated by sigmoid or sigmoid-like functions, e.g., logistic and hyperbolic tangent (tanh). Since the rate of leaf emergence and senescence is not the same in general for each plant, having a separate logistic function for each phase works well in practice, hence it is typical to use "double-sigmoid" functions. Preferably, the crop model according to the present invention uses a double-sigmoid function based on the tanh, which is given by Equation (1)

$$v(t;\theta)=\theta_1+\frac{1}{2}\theta_2(\tanh(\theta_5(i-\theta_3))-\tanh(\theta_6(t-\theta_4))). \quad (1)$$

The function (1) approximates the EVI for a given time t, measured in units of Day of Year (DOY). Curve 820 is an example of the curve of equation (1). It has six parameters, denoted by $\theta=(\theta_1, \ldots, \theta_6)$, each controlling a different aspect of the curve. Parameters $\theta_1$ and $\theta_2$ determine the base and amplitude of the curve, respectively. Parameters $\theta_3$ and $\theta_5$ control the position and slope of the inflection point for the rising part of the curve, while $\theta_4$ and $\theta_6$ do the same for the falling part of the curve.

As one skilled will concur, there is a vast array of literature available on Bayesian inference and thus a discussion of those elements that are necessary to understand the crop model according to the present invention is provided. The goal of Bayesian inference in machine learning is to estimate probability distributions over model parameters. Consider a set of N observed quantities $y=(y_1, \ldots, y_N)$ and a probabilistic model, with parameters $\theta$, explaining the data, resulting in the probability distribution $p(y|\theta)$. In Bayesian modeling the model parameters $\theta$ are treated as a random variable with prior distribution $p(\theta)$, ultimately yielding a joint distribution over observations and parameters $p(y,\theta)=p(y|\theta)p(\theta)$. This is sometimes referred to as a generative model since it explains how the model parameters $\theta$ and the observed data y are (stochastically) "generated."

During inference, it is often desired to model the values of $\theta$ given a set of observations y, and a probability distribution that captures this well is the so-called posterior distribution $p(\theta|y)$, given by $$p(\theta\mid y)=\frac{p(y\mid\theta)p(\theta)}{\int_{\theta'}p(y\mid\theta')p(\theta')} \quad (2)$$

which expresses how the model parameters behave given that some data have been observed. For example, the mean and the mode of the posterior (2) could be interpreted as the average and "most probable" values (respectively) for the model parameters given the observed data. Unfortunately, depending on the form of the joint distribution and the dimensionality of $\theta$, it is often impossible to compute the posterior exactly, due to the integral in the denominator of the expression in equation (2).

To approximate the posterior distribution, the crop model according to the present invention employs a method known as Markov Chain Monte Carlo (MCMC) sampling. MCMC algorithms draw samples of $\theta$ from the posterior and only require the ability to evaluate the joint distribution for a given value of $\theta$. In many situations, a set of samples from a distribution can be just as useful as the distribution itself. For example, given a set of S samples $\theta^{(1)}, \ldots, \theta^{(S)}$ from the posterior $p(\theta|y)$, the mean of the distribution can be approximated using the Monte Carlo principle as $$\mathbb{E}[\theta\mid y]\approx\frac{1}{S}\sum_{i=1}^{S}\theta^{(i)}. \quad (3)$$

Similarly, the mode of the posterior can be approximated by simply taking the sample of $\theta$ with the highest evaluation of the posterior density. In one embodiment, the crop model according to the present invention employs a specialized MCMC algorithm called Hamiltonian Monte Carlo (HMC), which is particularly effective at generating these samples by using the gradient of the joint distribution with respect to $\theta$ to explore the space of the distribution more efficiently.

Accordingly, the crop model according to the present invention is configured to capture the visual growth of planted crops, ultimately explaining observed remote sense imagery. In order to keep the model complexity manageable, the following simplifying assumptions are made: (1) a crop planted in a field grows in a way that is a function of the crop type, (2) the amount of "greenness" in the field varies as the crop grows and can be approximated by a function, and (3) the remote sense imagery (e.g., EVI) provides noisy observations of this function. Further, as is noted above, the crop model according to the present invention is a Bayesian statistical model, which means that it also assumes this process is stochastic and that both observed quantities and model parameters will be treated as random variables.

Figure 9:
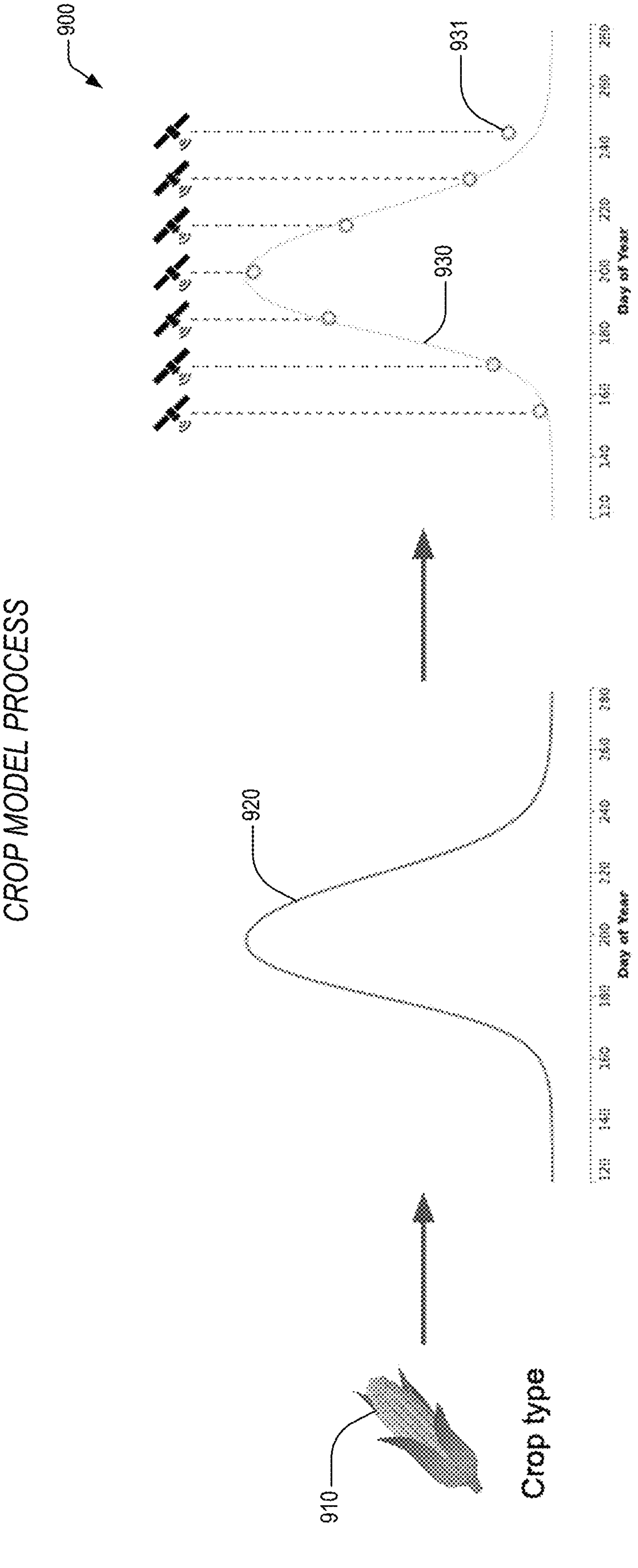
FIG. 9 is a diagram depicting an exemplary process according to the present invention for modeling a crop that exclusively employs remote sense data.

The following steps describe the stochastic process represented by the crop model, which are illustrated in FIG. 9. The result of this process is a joint probability distribution that captures the dependencies between all variables, and which is illustrated as a graphical model in FIG. 10. As FIG. 9 illustrates, a planted crop 910 grows in a field and produces a visual growth curve in the form of the double-sigmoid function 920. The system 400 according to the present invention observes noisy measurements 931 around the curve 930 as EVI satellite images of the field.

The steps followed by the model are noted below.

A. A crop c is chosen from a list of K possible crops, drawn from a categorical distribution $c\sim\mathrm{Cat}(\pi)$, where $\pi=(\pi_1, \ldots, \pi_K)$ is the vector of prior probabilities of known crops $$\left(\text{with } \sum_{k=1}^{K}\pi_{K^\cdot}=1\right).$$

B. The planted crop grows and produces an EVI curve, which follows the double-sigmoid function (1). The growth of the curve depends on the crop type c, i.e., the VI value for the growth curve of crop c at time t is given by v (t;θc), where θc is the set of double-sigmoid parameters for crop type c. Importantly, the crop model comprises a set of growth curve parameters $\theta_k$ for each crop type k=1, . . . , K, which can be thought of as the specific growth signatures for each crop. The set of all per-crop growth-curve parameters is denoted by $\theta=(\theta_1, \ldots, \theta_K)$.

C. The growth of the crop at T (known) times, $t_j$, j=1, . . . , Tis observed. These observations, $V_1, \ldots, V_T$, are noisy versions of the growth curve evaluated at the corresponding times, i.e., $V_j=v(t_j,\theta_c)+\varepsilon$, where ε is the noise variable. Assuming noise is Gaussian, then $V_j|\theta_c, \sigma \sim N(v(t_j;\theta_c),\sigma)$, where σ is the standard deviation of the noise distribution. It is further assumed that the observations are independent and identically distributed (iid), which implies that the distribution over the entire vector of observations V is given by $$p(V \mid \theta_c, \sigma) = \prod_{j=1}^{T} p(V_j \mid \theta_c, \sigma). \tag{4}$$

As mentioned above, this is sometimes referred to as a generative model, since it models the process by which the parameters "generate" the observations. This process ultimately specifies the joint probability distribution over the data V and the crop c, given by $p(c, V|\pi,\theta,\sigma)=p(c(\pi)p(V|c, \theta,\sigma)$. Here, π, θ, and σ are the parameters of the crop model, which are learned from labeled data using a Bayesian approach. The learned values for these parameters are employed during model prediction, where they are treated as known quantities and used to estimate crop type from EVI observations.

Given a new, previously unseen field, as well as values for the model parameters, the crop model is executed to estimate the crop type from the set of observed VI values of that field. In other words, given observed VI values $V_*=(V_{*1}, \ldots, V_{*T})$ at times $(t_{*1}, \ldots, t_{*T})$ and values for parameters $\pi=\hat{\pi}$, $\theta=\hat{\theta}$, and $\sigma=\hat{\sigma}$, it is desired to estimate the crop type $c_*$ which was planted in the field. Accordingly, the crop model does this by maximizing the posterior distribution over $c_*$, which is given by $$p\left(c_* \mid V_*, \hat{\pi}_j, \hat{\theta}, \hat{\sigma}\right) = \frac{p(c_* \mid \hat{\pi})p\left(V_* \mid c_*, \hat{\theta}, \hat{\sigma}\right)}{Z}. \tag{5}$$

The numerator of equation (5) is the joint distribution discussed previously, which can be easily computed. The denominator is the normalization constant that ensures the distribution sums to 1, given by $Z=\Sigma_k p(c=k,V_*|\hat{\pi},\hat{\theta},\hat{\sigma})$, which can be computed directly due to the relatively small value for K. This gives us a very straightforward method for estimating $c_*$: use the mode of the posterior distribution, given by $$\hat{c}_* = \underset{c_* \in \{1, \ldots, K\}}{\arg\max}\; p\left(c_* \mid V_*, \hat{\pi}, \hat{\theta}, \hat{\sigma}\right). \tag{6}$$

That is, the value of the posterior (5) is computed for all K possible values of $c_*$ and output the one that has the highest posterior evaluation.

Figure 6:
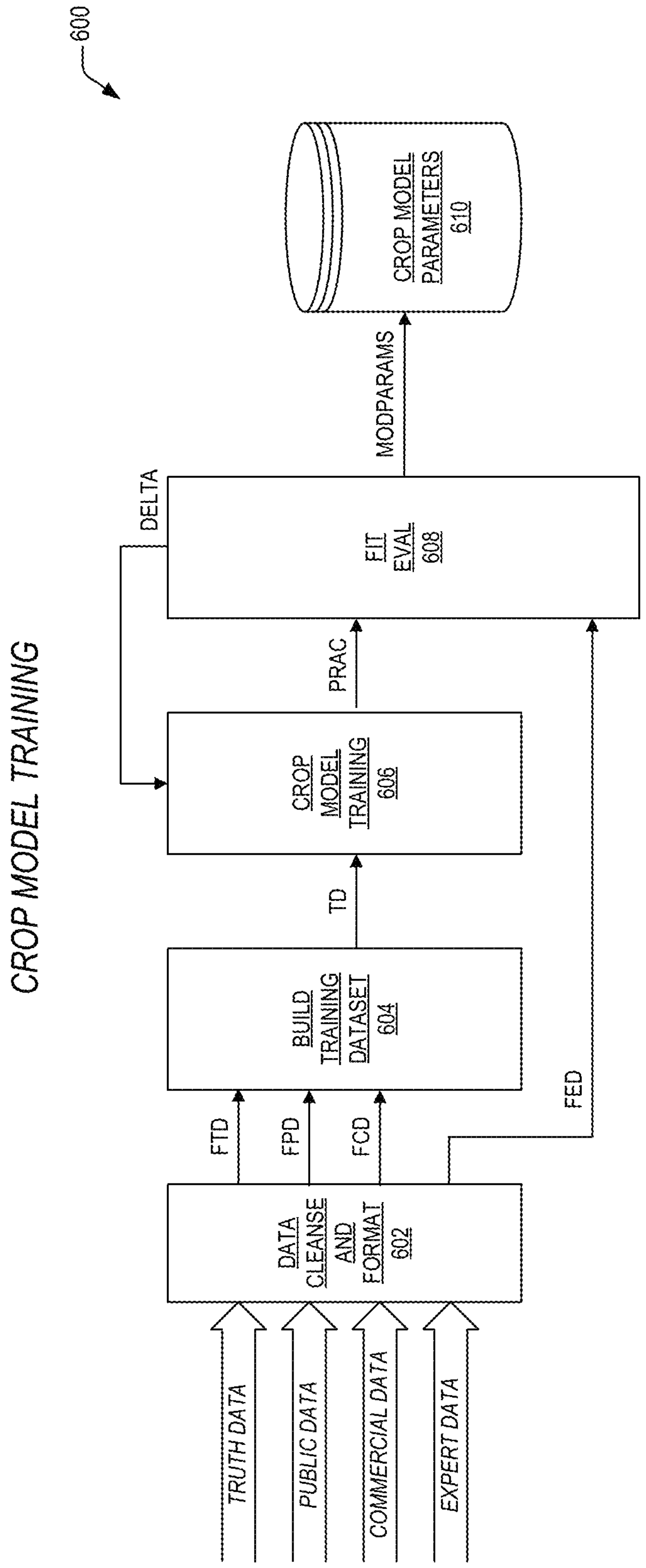
FIG. 6 is a flow diagram detailing a method according to the present invention for training a Bayesian crop model to predict agricultural management practices.

The process employed by the training processor 455 to train the crop model is shown in FIG. 6 at a summary level. The training processor 455 accesses truth data from the ground truth database 421 and expert data from the expert database 424. The truth data may comprise field-years of known historical management practices as applied to a sample of fields within the geographic region of interest (e.g., corn belt, wheat belt, cotton belt, etc.). In one embodiment the number of field-years is ten years, though other embodiments are contemplated. The training processor may further access the public database 422 and the commercial database 423 to retrieve field geometries and locations for the sample of fields, remote sense images corresponding to the field-years for the sample of fields, and other metadata that corresponds to the sample of fields.

At block 602, the data is cleansed, formatted, and missing data is estimated as is described above with reference to FIG. 2. Formatted truth data is output via bus FTD, formatted public data is output via bus FPD, formatted commercial data is output via bus FCD, and formatted expert data is output via bus FED. The formatted truth data, public data, and commercial data are provided to block 604, which builds the training dataset that is employed to train the crop model according to the present invention. The formatted expert data is provided to block 608 and will be employed as known outputs of the model, which are used as the model parameters are iteratively modified until the model predictions converge to the formatted expert data. The training dataset is provided to block 606.

At block 606, an iteration of the crop model is executed to generate predictions of management practices for each of the field-years along that correspond to the sample of fields. These practices are output on bus PRAC.

At block 608, the outputs on PRAC are compared to the formatted expert data provided on bus FED and error terms are provide back to the crop model in block 606 via bus DELTA. Thus, the model parameters are iteratively modified to the point that the model predictions on PRAC converge to the expert data on FED with acceptable error. When this occurs, the crop model is considered to be trained and the model parameters and provided on bus MODPARAMS to a crop model parameters database 610 resident within the crop model processor 453. The crop model parameters are accessed then by the crop model processor 453 to configure the crop model for execution in operation.

As is noted above, the training process of FIG. 6 may be periodically performed as new expert or remote sense data becomes available to improve the accuracy and reliability of the crop model. The algorithms employed to train the crop model are detailed in the following paragraphs.

As is discussed above, crop type prediction requires known values for the model parameter variables π, θ, and σ. Since it is infeasible to manually determine and set values for each of these parameters (e.g., the growth curve parameters for each crop type), the parameters are learned from data. Specifically, a set of field-years is used for which the crop type is known (ground truth data), and then Bayesian inference is employed to learn the posterior distributions over the parameters.

Consider a set of L field-years annotated with the planted crop type. The fields are located across the corn belt and the years range from 2006 to 2019. Let $c=(c_1, \ldots, c_L)$ be the crop types for these field-years, and $V=(V_1, \ldots, V_L)$ be the observed EVI data for each. The posterior distribution over model parameters (π,θ,σ) given the observed values c and V is $$p(\pi, \theta, \sigma \mid V, c, \rho, \phi, \psi) \propto p(\pi \mid \rho)p(\theta \mid \phi)p(\sigma \mid \psi)p(c, V \mid \pi, \theta, \sigma), \quad (7)$$

where the first three factors are the prior distributions for parameters π, θ, and σ, which depend on constants ρ, ψ, and φ, respectively. The last factor is the likelihood function, which, assuming each field-year is independent of one another, is simply the product of their individual likelihood. That is, the likelihood can be factored as $$p(c, V \mid \pi, \theta, \sigma) = \prod_{l=1}^{L} p(c_l, V_l \mid \pi, \theta_{c_l}, \sigma), \quad (8)$$

and each individual factor in the product can be computed as described above.

Inference on the posterior (7) is performed by applying the sampling approach discussed above, namely, that the HMC algorithm is executed to draw samples from the posterior and the samples are used as an approximation of the distribution. For the final output of the training procedure, which is denoted by ($\hat{\pi}$, $\hat{\theta}$, $\hat{\sigma}$), the expected value for the model parameters is chosen under the posterior distribution, which is approximated by $$(\hat{\pi}, \hat{\theta}, \hat{\sigma}) = \frac{1}{S}\sum_{i=1}^{S}(\pi^{(i)}, \theta^{(i)}, \sigma^{(i)}). \quad (9)$$

The following prior distributions are assigned to each of the parameter variables. For π, a Dirichilet prior, e.g., π~Dir(φ is used, which is a distribution over probability vectors. Similarly, a common practice is followed by placing an inverse-gamma prior on σ, giving σ~IG($\psi_1$,$\psi_2$). Finally, each element of θ is treated as a priori independent and normal priors are placed on each parameter. Specifically, let $\theta_{ki}$~N($\varphi^{\mu}_{i}$,$\varphi^{\sigma}_{i}$), where k=1, . . . , K is the crop type and i=1, . . . , 6 is the parameter of the double-sigmoid function (e.g., $\theta_{23}$ is the third parameter for the growth curve of the second crop).

In principle, specifying the priors and the likelihood is sufficient for an HMC algorithm to converge (i.e., to reliably approximate the posteriors). However, the present inventors have noted that specifying initial values for the parameters resulted in much quicker convergence. Best performance is obtained by specifying initial values of $\theta_{ki}$ to the prior means $$\varphi_i^{\mu}.$$

One of the advantages of using a Bayesian generative model is the flexibility it provides for extending it. Since the crop model according to the present invention captures the causal relationships between different variables/entities, adding components to the model is simply a matter of finding their place in the generative process. For example, the model process described with reference to FIG. 9 only models the dependency of the growth curve on the crop type. However, there are several factors that determine the growth curve for a crop planted in a field, e.g., the planting date. Advantageously, the crop model according to the present invention can be extended to account for the date the field was planted, the emergence date, the start date of senescence, and ultimately the harvest date.

Figure 10:
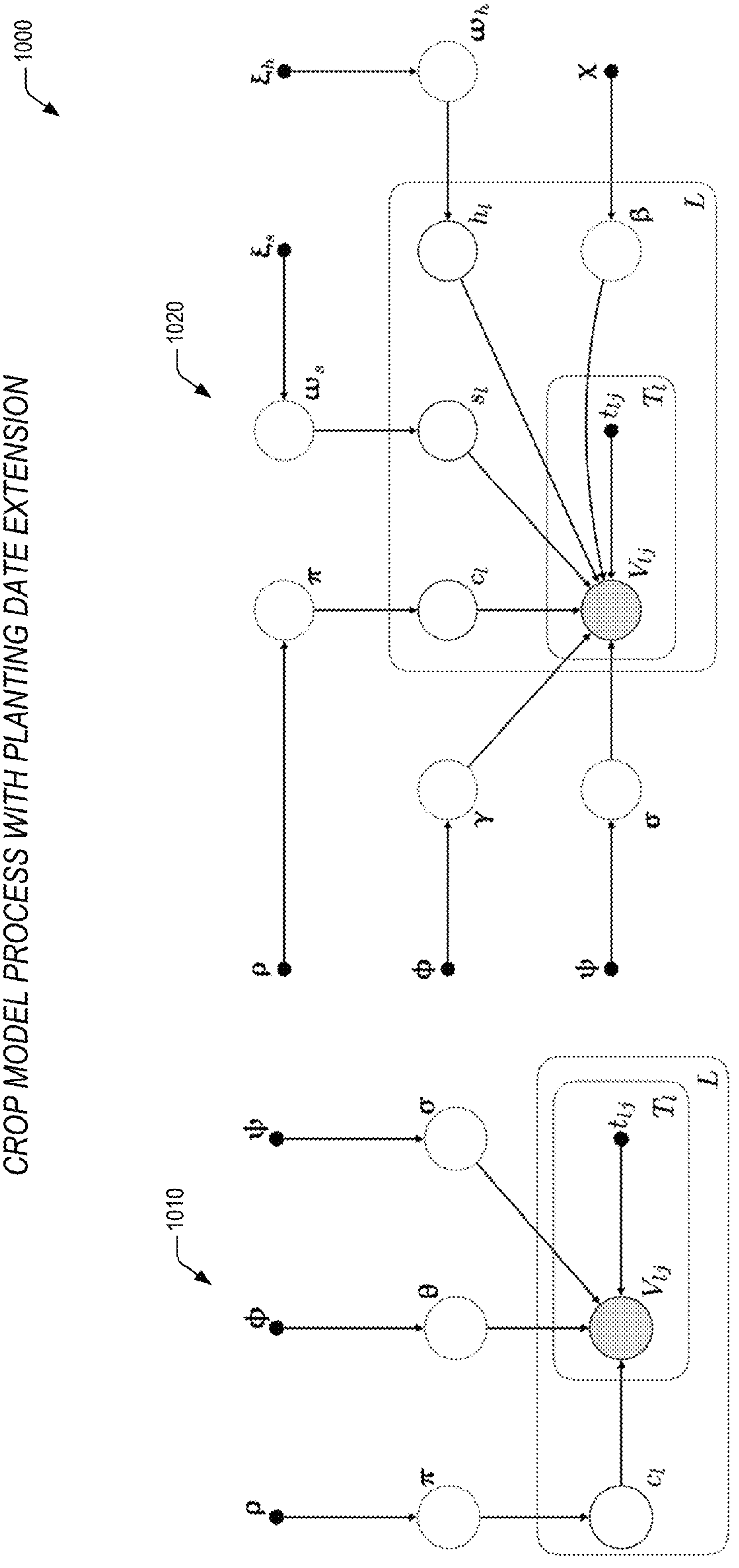
FIG. 10 is a diagram featuring random variables and their dependencies for both modeling a crop and modeling a crop and its planting date according to embodiments of the present invention.

FIG. 10 shows a graphical model 1010 for both identification of crop type and an extension 1020 for identification of crop type and planting date. Each model 1010, 1020 is a graphical representation of a joint distribution, where nodes represent random variables and directed edges indicate statistical dependence between variables. Shaded nodes denote observed variables while black dots represent known, constant quantities. Unshaded nodes with lighter outlines indicate random variables which are learned from data during the training phase but are treated as known during the prediction phase. Finally, rectangular plates represent iteration over independent and identically distributed (iid) variables. In model 1010, it is noted that the jth observed EVI value for field-year l, $V_{lj}$, depend on the crop type $c_l$ as well as the curve parameters θ) and the standard deviation of the observation noise σ, and $c_l$ itself depends on the vector of crop type probabilities π. Model 1020 depicts the graphical model after incorporating planting dates, where $V_{lj}$ additionally depends on the planting date si, itself having a prior dependence on $\omega_s$. See text for a detailed discussion of the model and all its parameters.

Figure 11:
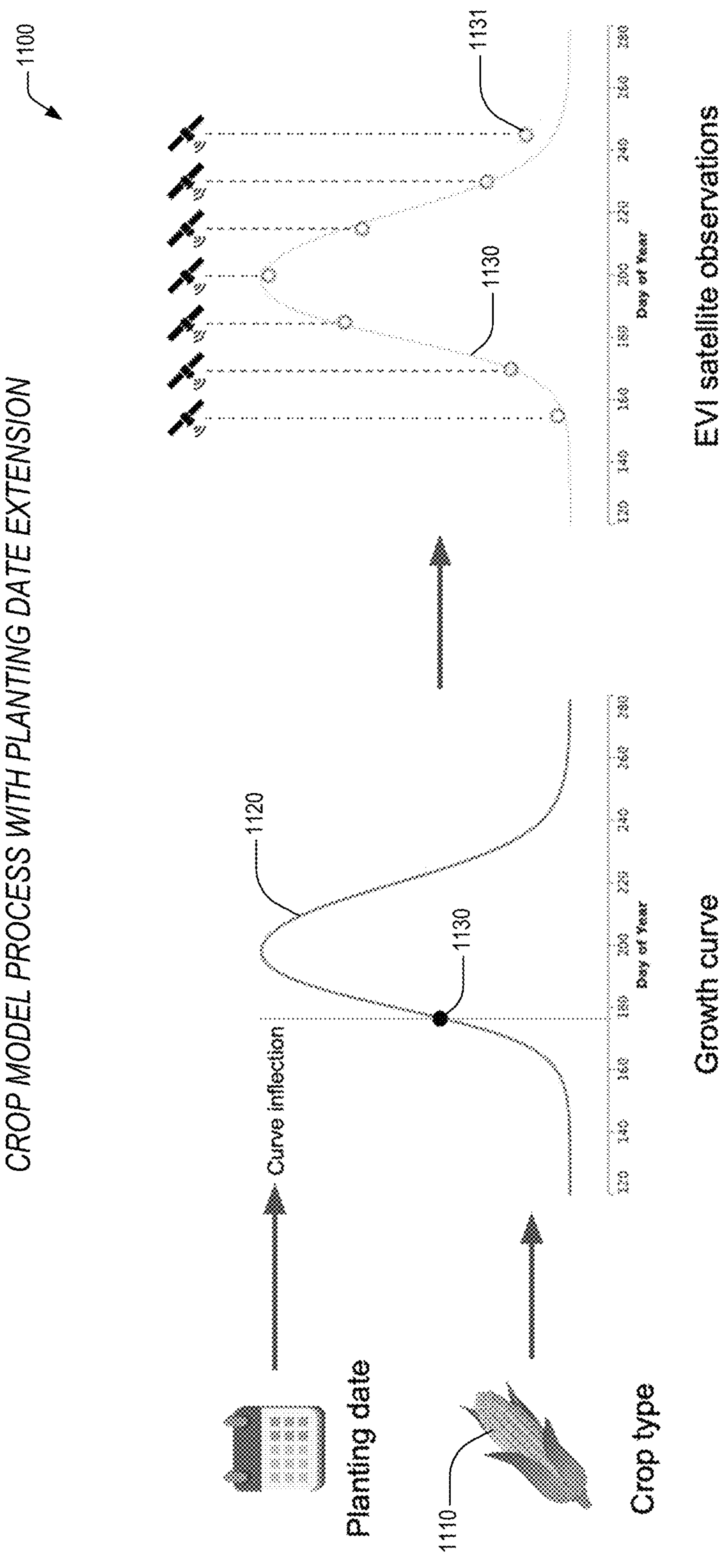
FIG. 11 is a diagram depicting an exemplary process according to the present invention for modeling a crop and its planting date that exclusively employs remote sense data.

FIG. 11 is an illustration of how the crop model is employed to predict planting data from observed data. Similar to the process discussed above with reference to FIG. 9, the process of FIG. 11 shows that a planted crop 1110 grows in a field and produces a visual growth curve in the form of the double-sigmoid function 1120, but a new variable si is introduced that represented the planting date for field-year l, measured in days of year (DOYs). The system 400 according to the present invention observes noisy measurements 1131 around the curve 1130 as EVI satellite images of the field. However, the inflection point 1121 of the curve 1120 (along with its location) depends on the planting date, and thus, the crop model according to the present invention determines the planting date based on the inflection point 1121 during emergence. Though not shown in the diagram 1100, the present inventors note that substantially similar processes are followed to determine emergence date, start of senescence, and harvest date.

The EVI observations (and the growth curve) for a field-year are modeled to depend on the planting date. Amending the three-step process discussed above, a step is added stating that a planting date s for a field-year is chosen from a normal distribution, i.e., s~N($\omega^{\mu}$,$\omega^{\sigma}$) after crop type c was chosen.

Similarly, the process by which θ is chosen changes. As discussed above the elements of θ are drawn from normal distributions, except for $\theta_3$, which is the parameter that controls the rising inflection point of the double-sigmoid curve; the vector θ without $\theta_3$ is denoted as γ. The inflection point of the double-sigmoid curve has been found to reliably predict the planting date this fact and is employed to model the planting date s as being linearly related to $\theta_3$:$\theta_3$=$\beta_0$s+$\beta_1$, where β=($\beta_0$,$\beta_1$) is the vector of linear coefficients.

The training procedure for the extended crop model is essentially unchanged compared to the original crop type model. Prior distributions are placed on the new parameters γ, ω, and β, inference via HMC sampling is performed on the posterior distribution over the model parameters p(π,γ,σ,ω,β|c,V), and their expected values are approximated, which are denoted by ($\hat{\pi}$,$\hat{\theta}$,$\hat{\tau}$,$\hat{\omega}$,$\hat{\beta}$).

For prediction, the configuration also changes very little. Given a new field-year with VI observations $V_*$, the goal is to predict the crop type $c_*$ and the planting date $s_*$. Following the same reasoning as above, it is desired to do inference on the posterior distribution p $(c_*, s_* | / V_*, \hat{\pi}, \hat{\gamma}, \hat{\sigma}, \hat{\omega}, \hat{\beta})$. However, in this case the posterior cannot be calculated directly since it involves a nested integral and summation. Instead, HMC is used to draw samples from the marginal posterior $p, s_* | V_*, \hat{\pi}, \hat{\gamma}, \hat{\sigma}, \hat{\omega}, \hat{\beta})$ and these samples are used to approximate the marginal posterior over the crop type $c_*$:

$$\tilde{p}(c_* \mid V_*, \hat{\pi}, \hat{\gamma}, \hat{\sigma}, \hat{\omega}) \approx \frac{1}{S} \sum_{i=1}^{S} p\left(V_* \mid s_*^{(i)}, \hat{\gamma}, \hat{\sigma}, \hat{\omega}, \hat{\beta}\right), \tag{10}$$

where $$s_*^{(1)}, \ldots, s_*^{(S)}$$

are the samples drawn from the marginal posterior over the planting date $s_*$, and $\tilde{p}$ is the unnormalized probability distribution (which can easily be normalized due to K being relatively small). Finally, the mode of the posterior over c, is output and the expectation of $s_*$ over its posterior. Substantially similar changes without undue experimentation can be made to the model to provide extensions for other management practices including emergence date, start of senescence, and harvest date.

Results of the trained crop model are provided to the management practices processor 452, which in conjunction with the crop model processor 453, as described above, determines the practices for which the model is configured. These practices are stored in the field database 451.

The compliance processor 454 is configured to access the management practices from the field database 451 along with incentive program requirements for each field that is participating in the one or more grower incentive programs. The compliance processor 454 may determine interim compliance based upon the management practices and may determine compliance with overall incentive program requirements. For fields that comply with overall program requirements, the compliance processor 454 may further direct transmission of electronic messages to the grower, the incentive program administrators, and/or third-party payors ("banks") to transfer payment for compliant participation in the one or more incentive programs, as is discussed above with reference to FIG. 1.

Figure 5:
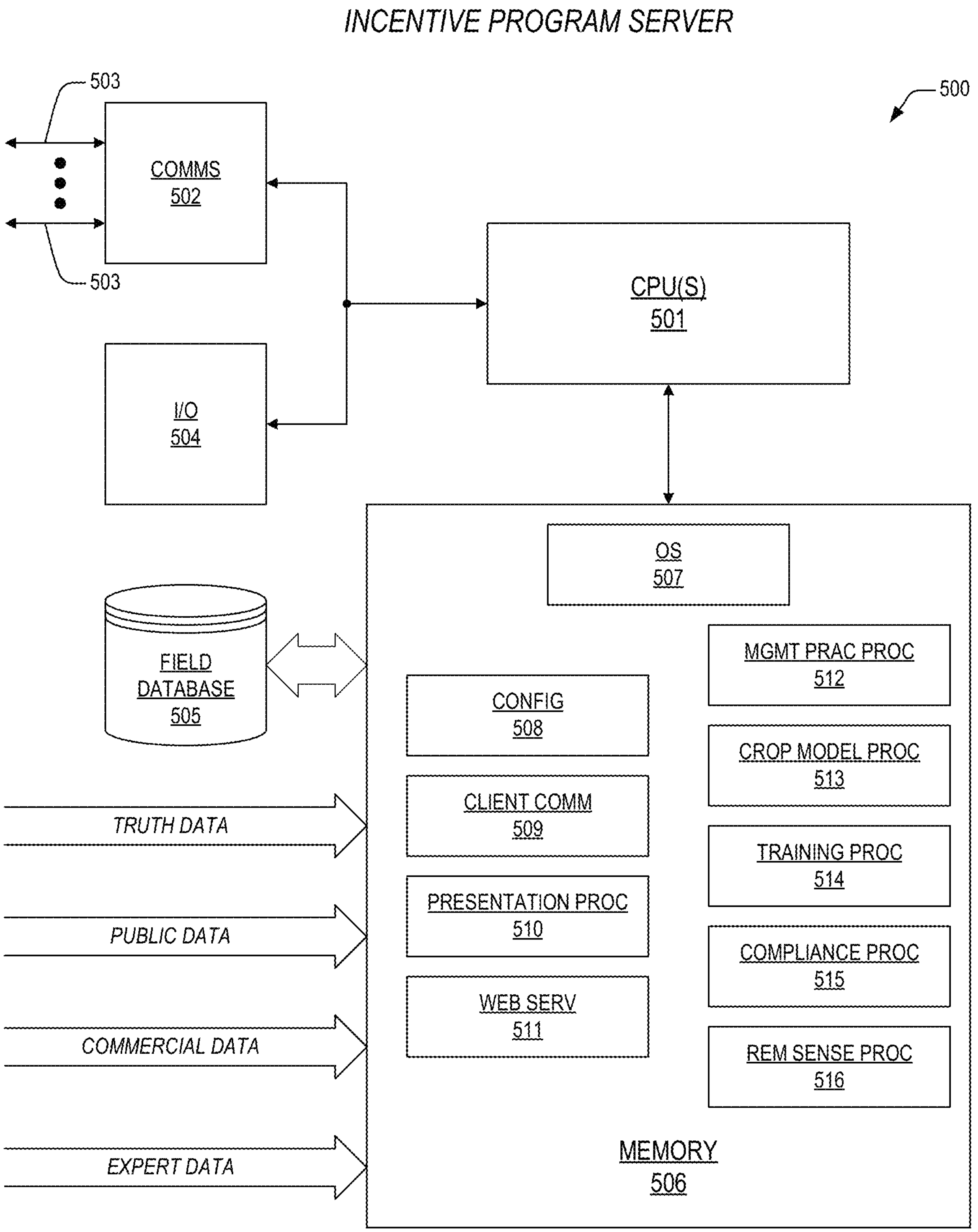
FIG. 5 is a block diagram illustrating an incentive program server, such as the server of FIG. 4.

Now referring to FIG. 5, a block diagram 500 is presented illustrating an incentive program server, such as the server 430 of FIG. 4. The incentive program server 500 may include one or more central processing units (CPU) 501 that are coupled to memory 506 having both transitory and non-transitory memory components therein. The CPU 501 is also coupled to a communications circuit 502 that couples the incentive program server 500 to the internet cloud 410 via one or more wired and/or wireless links 503. The links 503 may include, but are not limited to, Ethernet, cable, fiber optic, and digital subscriber line (DSL). As part of the network path to and through the cloud 410, providers of internet connectivity (e.g., ISPs) may employ wireless technologies from point to point as well.

The incentive program server 500 may also comprise input/output circuits 504 that include, but are not limited to, data entry and display devices (e.g., keyboards, monitors, touchpads, etc.). The memory 506 may be coupled to a field database 505 and to the databases 421-424 described with reference to FIG. 4 above. Though the incentive program server 500 is shown directly coupled to databases 421-424 and 505, the present inventors note that interfaces to these data sources may exclusively be through the communications circuit 502 or may be through a combination of direct interface and through the communications circuit 502, according to the source of data.

The memory 506 may include an operating system 507 such as, but not limited to, Microsoft Windows, Mac OS, Unix, and Linux, where the operating system 507 is configured to manage execution by the CPU 501 of program instructions that are components of one or more application programs. In one embodiment, a single application program comprises a plurality of code segments 508-516 resident in the memory 506 and which are identified as a configuration code segment CONFIG 508, a client communications code segment CLIENT COMM 509, a presentation processor code segment PRESENTATION PROC 510, a web services code segment WEB SERV 511, management practices processor code segment MEMT PRAC PROC 512, a crop model processor code segment CROP MODEL PROC 513, a training processor code segment TRAINING PROC 514, a compliance processor code segment COMPLIANCE PROC 515, and a remote sense processor code segment REM SENSE PROC 516.

Operationally, the incentive program server 500 may execute one or more of the code segments 508-516 under control of the OS 507 as required to enable the Incentive program server 500 to ingest new data from external data sources 421-424, to employ data from the sources 421-424 in crop models to that translate the data into remotely sensed EVI curves that are employed to predict field management practices for purposed of enrollment in grower incentive programs and for compliance monitoring and verification. The incentive program server 500 may further be configured to execute one or more of the code segments 508-516 under control of the OS 507 as required to enable the incentive program server 500 to format and present results and corresponding parcel data to the client applications 404-406 executing on their respective client devices 401-103 and to receive communications therefrom that users specify confirm/amend prepopulated field enrollment applications.

CONFIG 508 may be executed to place the server 1000 into an operational or maintenance mode, where the maintenance mode may be entered to allow for ingestion of new data from the data sources 421-424 via automated or manual means. CLIENT COMM 509 may be executed to perfect reliable transfer of information between the incentive program server 500 and client applications 404-406 executing on respective client devices 401-403. PRESENTATION PROC 510 may be executed to perform searches of the field database 505, to provide search results, and to interact with client applications 404-406 executing on respective client devices 401-403 as is described above with reference to FIG. 1-4. WEB SERV 511 may be executed to provide for formatting of information provided by PRESENTATION PROC 510 for transmission to the client applications 404-406 and for formatting of information that is provided to PRESENTATION PROC 510 which has been received from the client applications 404-406.

MGMT PRAC PROC 512 may be executed to perform any of the functions and operations described above with reference to the management practices processor 452 of FIG. 4. CROP MODEL PROC 513 may be executed to perform any of the functions and operations described above with reference to the crop model processor 453 of FIG. 4. TRAINING PROC 514 may be executed to perform any of the functions and operations described above with reference to the training processor 455 of FIG. 4. COMPLIANCE PROC 515 may be executed to perform any of the functions and operations described above with reference to the compliance processor 454 of FIG. 4. REM SENSE PROC 516 may be executed to perform any of the functions and operations described above with reference to the remote sense processor 456 of FIG. 4.

The incentive program server 500 according to the present invention may comprise one or more application programs executing thereon to perform the operations and functions described above. In various embodiments, the one or more application programs are configured to perform the functions discussed above and may be stored in non-transitory storage memory, transferred to transitory storage memory at run time, and executed by the one or more of the processors 508-516.

The incentive program server 500 according to the present invention is configured to perform the functions and operations as discussed above. The server 500 may comprise digital logic, analog logic, circuits, devices, or microcode (i.e., micro instructions or native instructions), or a combination of logic, circuits, devices, or microcode, or equivalent elements that are employed to execute the functions and operations according to the present invention as described herein.

Figure 7:
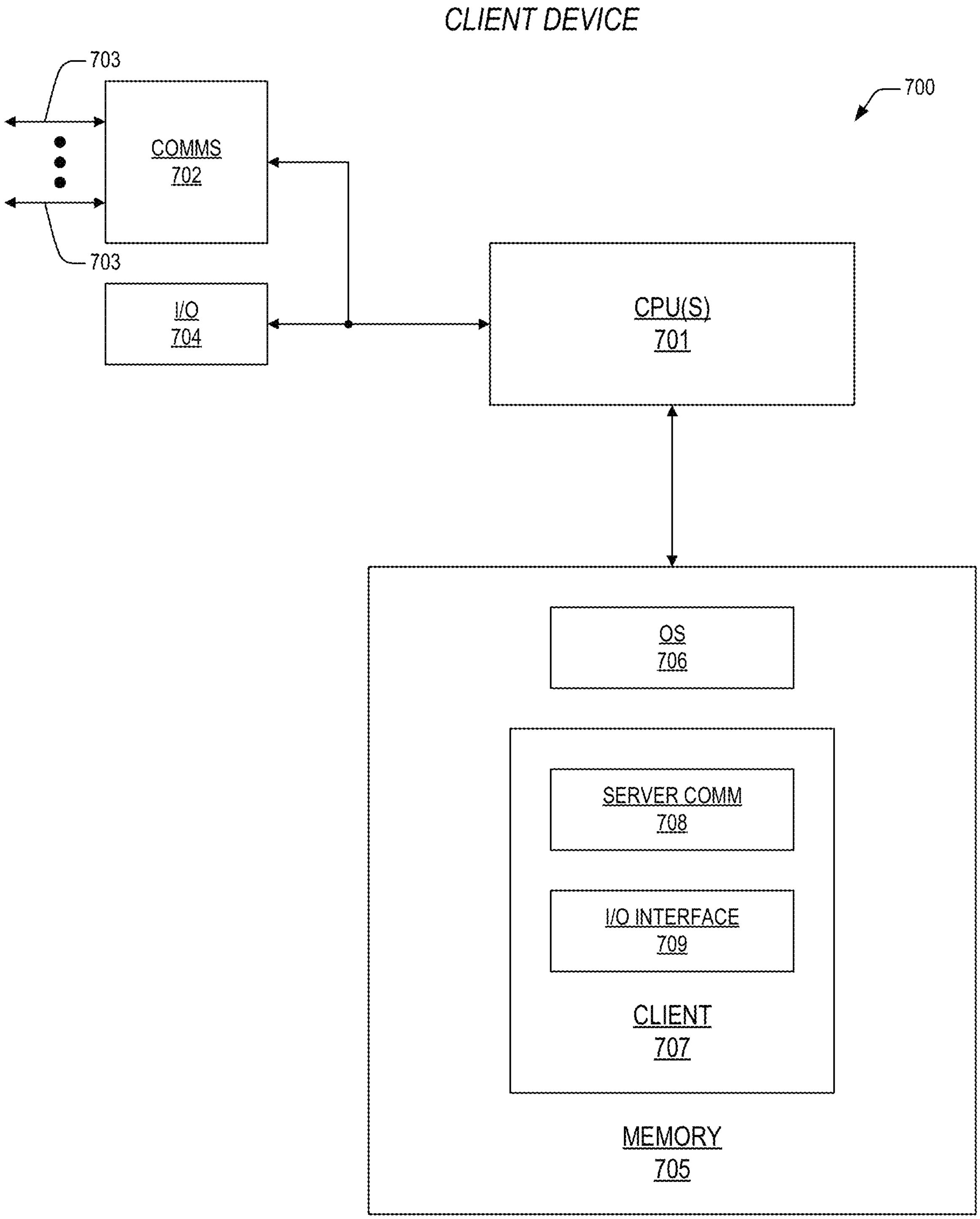
FIG. 7 is a block diagram showing a client device, such as the client devices of FIG. 4.

Now referring to FIG. 7, a block diagram is presented depicting a client device 700 according to the present invention, such as the client devices 401-403 discussed above with reference to FIG. 4. The client device 700 may include one or more central processing units (CPU) 701 that are coupled to memory 705 having both transitory and non-transitory memory components therein. The CPU 701 is also coupled to a communications circuit 702 that couples the client device 700 to internet cloud 70 via one or more wired and/or wireless links 703. The links 703 may include, but are not limited to, Ethernet, cable, fiber optic, and digital subscriber line (DSL).

The client device 700 may also comprise input/output circuits 704 that include, but are not limited to, data entry and display devices (e.g., keyboards, monitors, touchpads, etc.).

The memory 705 may include an operating system 706 such as, but not limited to, Microsoft Windows, Mac OS, Unix, Linux, iOS, and Android OS, where the operating system 706 is configured to manage execution by the CPU 701 of program instructions that are components of a client application program 707. In one embodiment, the client application program 707 comprises a server communications code segment SERVER COMM 708 and an I/O interface code segment I/O INTERFACE 709.

When executing on the client device 700, the client application program 707 provides for display of information provided by the incentive program server 500 on the input/output circuits 704 that enable a user to search for their fields in the field database 451, to select one or more grower incentive programs for participation, and to confirm and/or modify historical management practice data for those fields, which has been prepopulated in enrollment applications by the server 500. The SERVER COMM 708 segment may execute to receive this information and the I/O INTERFACE segment 709 may execute to transmit this information to the input/output circuit 704. The SERVER COMM 708 segment may execute to transmit this information and the I/O INTERFACE segment 709 may execute to receive this information to the input/output circuit 704.

The functions and operations described above with reference to the incentive program system 400 according to the present invention result in a significant improvement in this field of technology by providing a superior technique for translating sparse.

As one skilled in the art will appreciate, obtaining quantitative data regarding crop types and planting dates before harvest has many important applications, not least of which is yield estimation and crop management. Accordingly, an advantage of the method and system according to the present invention is the ability to identify the management practices discussed above, before the growing season is complete-known as an "in-season" prediction. An in-season prediction is performed the same way as a regular prediction as described above, except incomplete data for a field-year is passed as input.

A key advantage of the Bayesian crop model according to the present invention is that it does not rely upon an extensive amount of good quality training data. Rather, a causal approach is employed that encodes how the EVI values are expected to change as a result of crop growth. This method is general enough that it can be applied to a variety of geographical locations. The crop model is primarily dependent on the availability of good quality satellite imagery, something which is freely available due to the global coverage of Landsat and Sentinel-2 series of satellites. Given access to this imagery, in principle one only needs ground truth data for a few hundred field-years to obtain reliable results. This ability to work with a smaller sample of data facilitates the use of the crop model according to the present invention in geographical regions outside the US where large scale datasets like the Cropland Data Layer (CDL) may not be regularly available.

A further advantage of the present invention is that Bayesian models are also good at dealing with missing or mislabeled data. For instance, if the ground truth dataset had some fields with missing or incorrect planting dates, that would not drastically affect the overall distribution of planting dates learned by the model, and therefore the model predictions would be just as good. Similarly, the model does not need a high temporal cadence of satellite imagery for a field, as long as there are enough images available to reliably fit a growth curve, the model will be able to make reasonable predictions.

Yet another benefit of using the causal approach is that it becomes straightforward to extend the model to predict other crops. Simply extend the ground truth data to include sufficient number of field-years with the new crop, and the model will learn how EVI evolves for this crop. With some modifications, the model can be employed predict when a new field-year is growing a crop that is very different from any that the model has seen during its training. It may be advisable to label these as "Other Crop" or "Unknown" to avoid predicting incorrect labels and thereby improving overall estimates. The model according to the present invention can similarly easily incorporate additional sources of data, such as field latitude, as long as its effect on planting date or crop ID is understood. Along the same lines, we can also extend the current model to infer additional management practices, as is alluded to above with respect to harvest date. Modeling harvest data is substantially similar to estimating planting date, e.g., by modeling the harvest date as linearly related to the falling part of the EVI curve. From a data perspective, all that is needed is to know the harvest dates for most of the field-years in the ground truth dataset (the model will still work well if some harvest dates are missing). This approach of a growth curve-based Bayesian model can be extended to identify other management practices that have not been noted above. For instance, the time during the season when the growth curve is observed can be used to predict whether a field is growing a cash crop or a cover crop. In addition, deviations from the general growth curve may be employed to identify whether an operation like tillage or irrigation was performed on the field before planting.

The crop modeling technique presented herein is able to predict the crop type and planting date with an accuracy comparable to or better than current alternatives provided by US Department of Agriculture (USDA). This aspect makes it especially applicable for use in global regions where datasets like CDL and NASS planting date reports may not be available, but satellite imagery may be cheaply obtained and where it is feasible to survey a small number of fields. Additionally, the crop model according to the present invention generates predictions at the resolution of a single field, which is advantageous even for regions in the US since the USDA planting date estimates for instance are only available at state-level. The model according to the present invention also provides reliable in-season predictions as early as mid-August, about 2 weeks before typical corn/soy harvest in the Midwest and 4 months earlier than the corresponding USDA predictions are released. The model is straightforward to scale across large geographic regions including the contiguous United States.

Having now discussed the grower incentive program methods and system according to the present invention, along with its objects and advantages in overcoming limitations and challenges of the prior art, FIGS. 12-15 will now be discussed with reference to exemplary displays that a grower or agronomist may view on their client devices 401 for purposes of enrollment and participation in one or more grower incentive programs. The exemplary displays of FIGS. 12-15 are solely intended to provide a simple example of how the crop modeling system 400 according to the present invention may be practically employed and are not meant to restrict applications of the novel techniques discussed above with reference to FIGS. 1-11.

Figure 12:
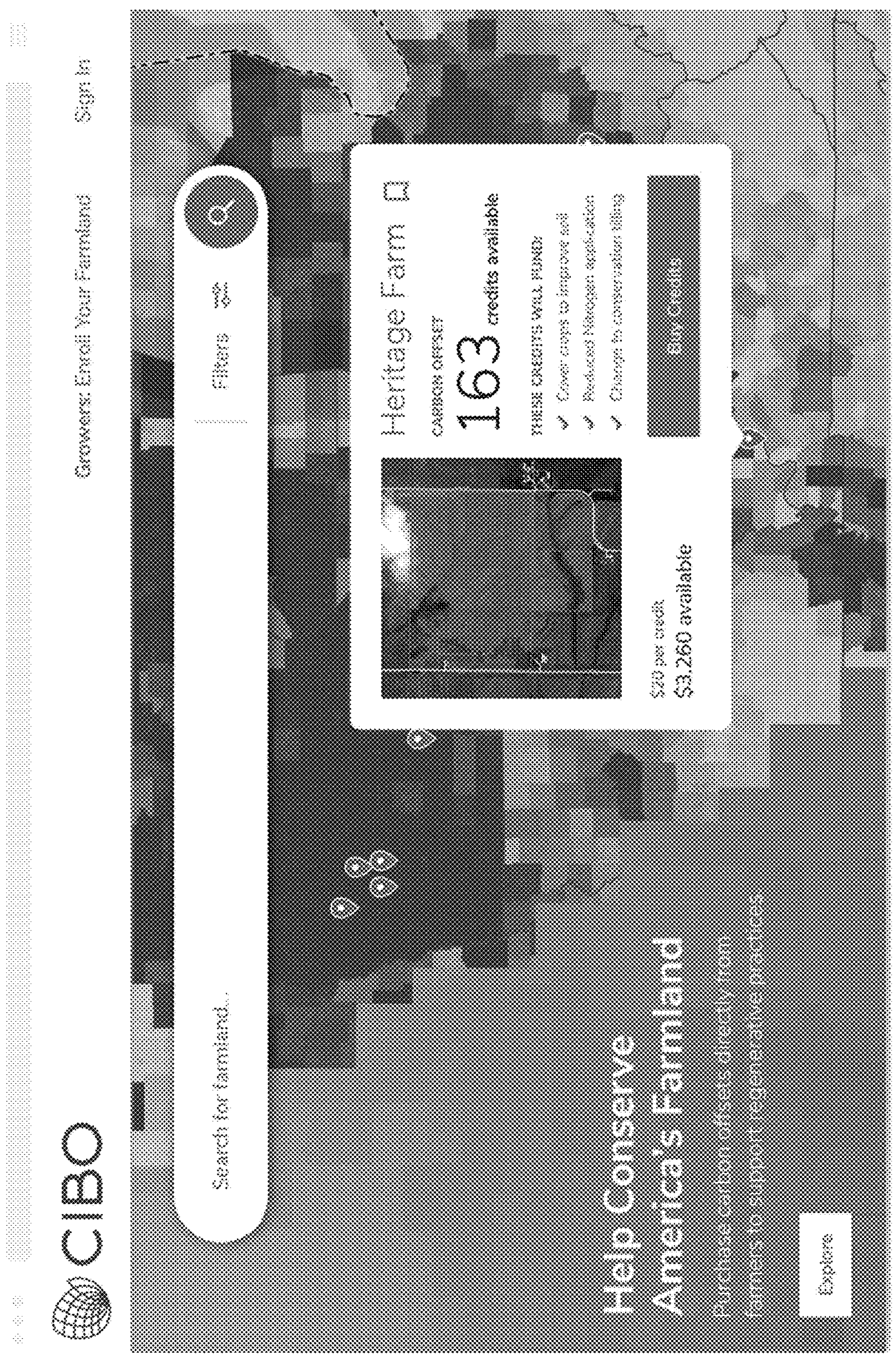
FIG. 12 is a diagram showing an exemplary grower incentive offer display according to the present invention, such as might be presented by the client device of FIG. 7.

Turning to FIG. 12, a diagram is presented showing an exemplary grower incentive offer display 1200 according to the present invention, such as might be presented by one of the client devices 401-403 of FIG. 4. In this exemplary embodiment, a farm Heritage Farm is shown to be available for purchase of 163 carbon credits at $20 per credit, which will be used to fun cover crops, reduced fertilization, and changes to more conservative tillage. This is the result of enrollment of a grower's field in a corresponding incentive program to perform these regenerative management practices. Accordingly, a portion of the available funds are reserved for payment to the grower upon successful compliance at the end of the growing season.

Figure 13:
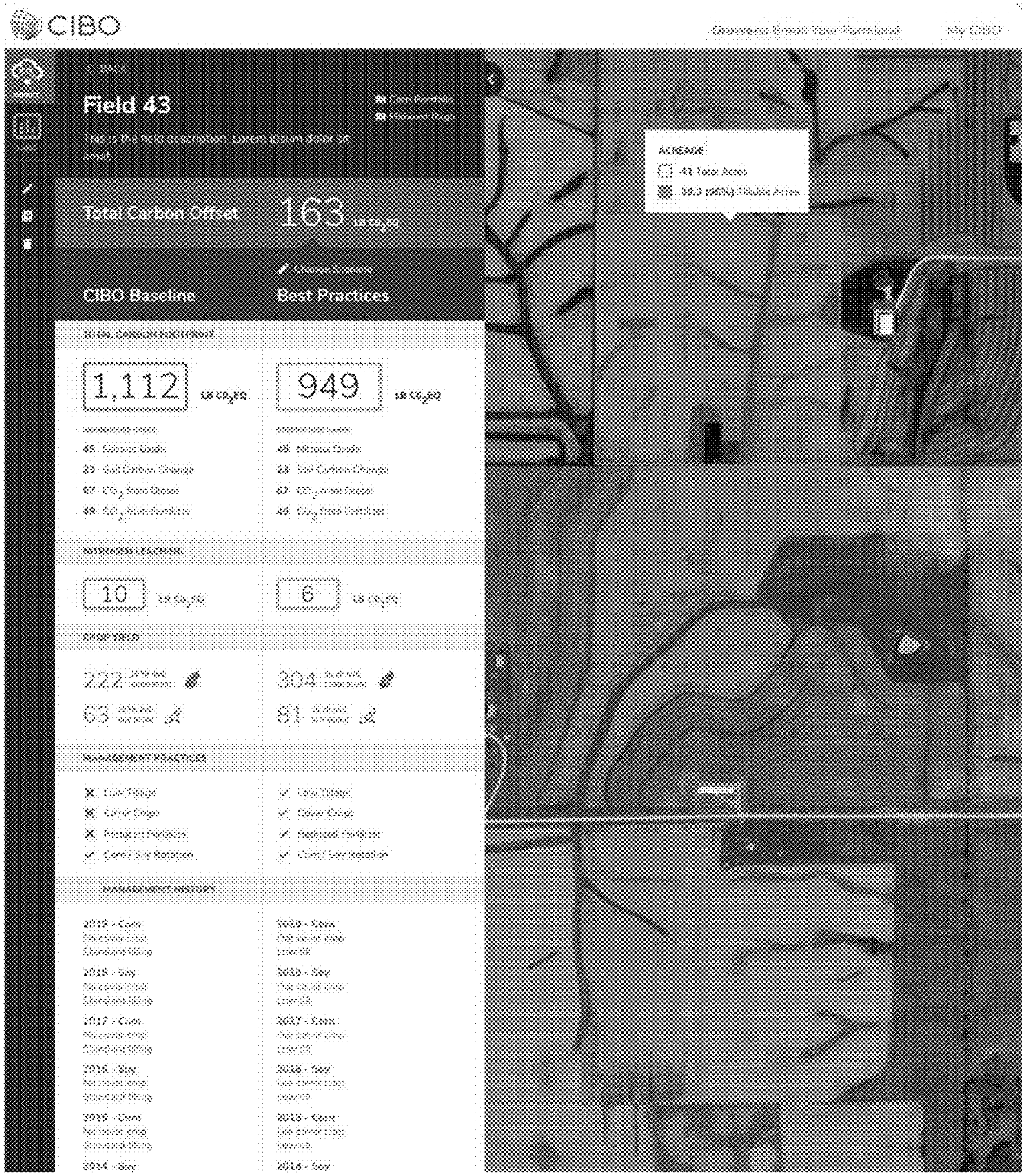
FIG. 13 is a diagram illustrating an exemplary management practices display according to the present invention, such as might be presented by the client device of FIG. 7.

Now referring to FIG. 13, a diagram is presented illustrating an exemplary management practices display 1300 according to the present invention, such as might be presented to a user on one or more of the client devices 401-403 of FIG. 4. The display shows the user management practices history for a field Field 43 that may be enrolled in a grower incentive program to utilize regenerative practices that may be monitored and verified by the system 400 according to the present invention. The management practices history has been generated by the system 400 via exclusive employment of remote sense images for the field.

Figure 14:
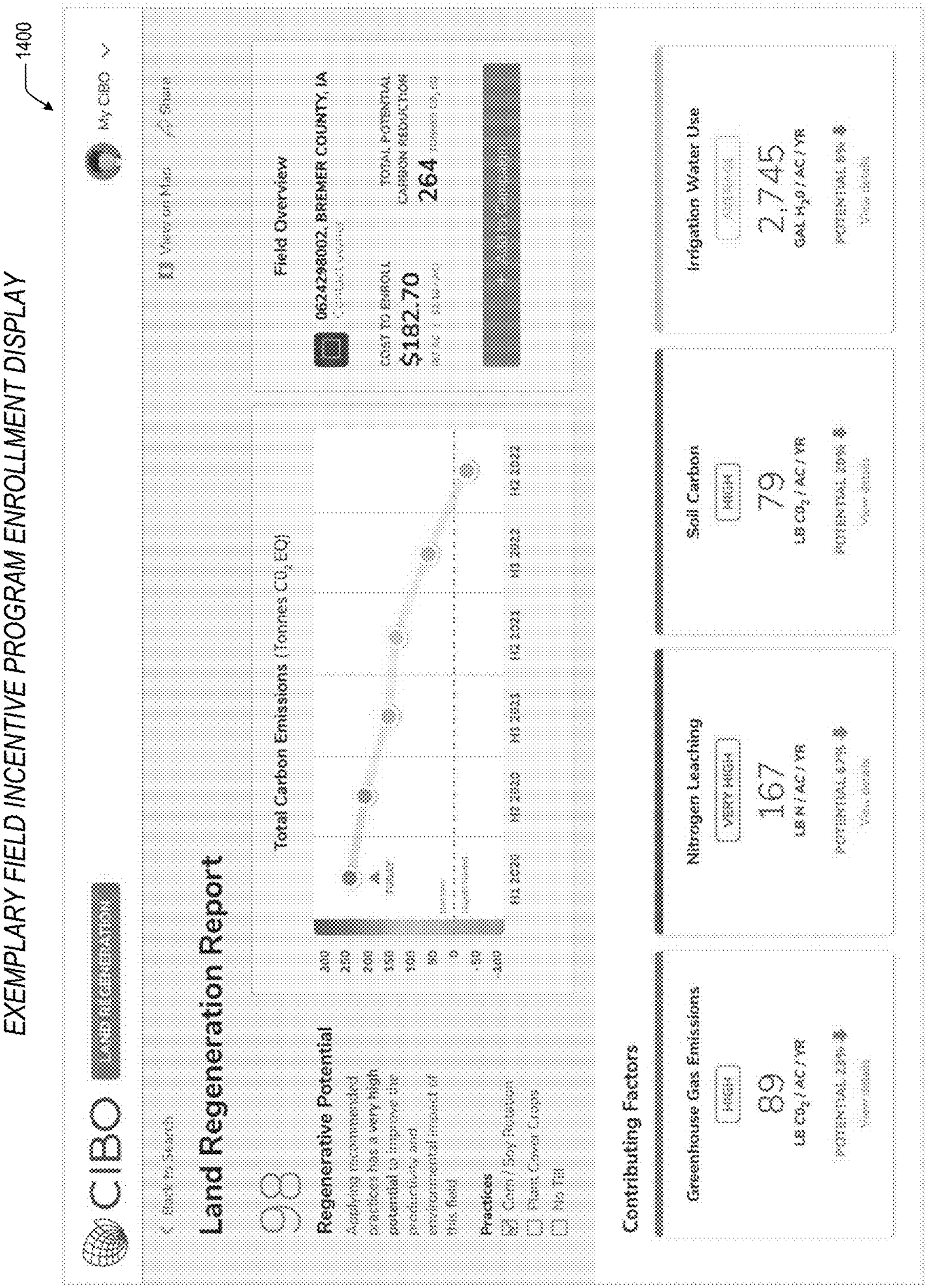
FIG. 14 is a diagram detailing an exemplary grower incentive program enrollment display according to the present invention, such as might be presented by the client device of FIG. 7.

Now turning to FIG. 14, a diagram is presented detailing an exemplary grower incentive program enrollment display 1400 according to the present invention, such as might be presented by one or more of the client devices 401-403 of FIG. 4. The display 1400 shows practices to which the grower must commit for the current growing system along with an option to enroll a corresponding field.

Figure 15:
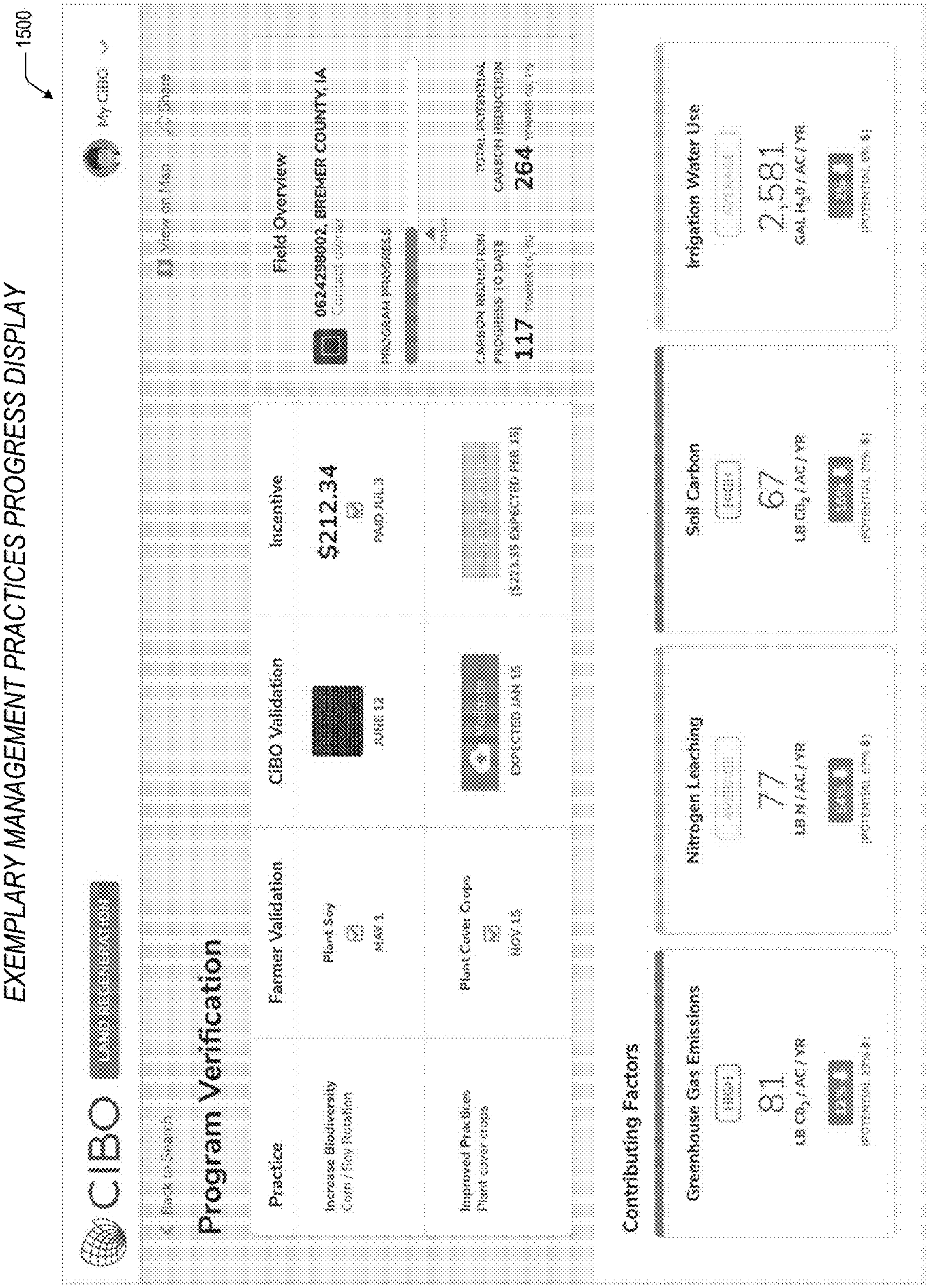
FIG. 15 is a diagram showing an exemplary grower incentive program compliance display according to the present invention, such as might be presented by the client device of FIG. 7.

Referring now to FIG. 15, a diagram is presented showing an exemplary grower incentive program compliance display 1500 according to the present invention, such as might be presented by one or more of the client devices 401-403 of FIG. 4. The display 1500 details the management practices required for the current growing season along with an interim validation by the system 400 of June 12, an expected final validation date (January 15), a partial funding amount that has been released and dispatched to the grower for interim compliance, and a residual incentive amount that will be released to the grower upon verification of final compliance with the required growing year management practices.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer program product, a computer system, a microprocessor, a central processing unit, or similar electronic computing device, that manipulates and transforms data represented as physical, electronic quantities within the computer system's registers and memories into other data similarly represented as physical quantities within the computer system memories or registers or other such information storage, transmission or display devices. The devices may comprise one or more CPUs that are coupled to a computer-readable storage medium. Computer program instructions for these devices may be embodied in the computer-readable storage medium. When the instructions are executed by the one or more CPUs, they cause the devices to perform the above-noted functions, in addition to other functions.

Note also that the software implemented aspects of the invention are typically encoded on some form of program storage medium or implemented over some type of transmission medium. The program storage medium may be electronic (e.g., read only memory, flash read only memory, electrically programmable read only memory), random access memory magnetic (e.g., a floppy disk or a hard drive) or optical (e.g., a compact disk read only memory, or "CD ROM"), and may be read only or random access. Similarly, the transmission medium may be metal traces, twisted wire pairs, coaxial cable, optical fiber, or some other suitable transmission medium known to the art. The invention is not limited by these aspects of any given implementation.

The particular disclosed above are illustrative only, and those skilled in the art will appreciate that they can readily use the disclosed conception and specific embodiments as a basis for designing or modifying other structures for carrying out the same purposes of the present invention, and that various changes, substitutions and alterations can be made herein without departing from the scope of the invention as set forth by the appended claims. For example, components/elements of the systems and/or apparatuses may be integrated or separated. In addition, the operation of the systems and apparatuses disclosed herein may be performed by more, fewer, or other components and the methods described may include more, fewer, or other steps. Additionally, unless otherwise specified steps may be performed in any suitable order.

Although specific advantages have been enumerated above, various embodiments may include some, none, or all of the enumerated advantages.

The invention claimed is:

1. A computer-implemented method for predicting agricultural management practices, the method comprising: generating a training dataset that comprises a plurality of years of known management practices associated with a plurality of fields dispersed within geographic region along with a corresponding plurality of years of first remote sense images; training a Bayesian crop model to predict the plurality of years of known management practices associated with the plurality of fields using the corresponding plurality of years of first remote sense images as inputs, the training comprising: cleansing the corresponding plurality of years of remote sense images by: removing images with first missing data below a prescribed threshold; retaining images with second missing data above the prescribed threshold; time-processing third data from other time-adjacent images that corresponds to the second missing data; and using the time-processed third data to replace the second missing data; combining spectral band images for each observation date to generate corresponding first composite images; combining first composite images for each observation date to create composite estimated growth curves for each of the plurality of fields; wherein the time-processing of the third data comprises generating reconstructed spectral values for missing portions of the remote sense images using temporally adjacent remote sensing images, and wherein combining the spectral band images comprises generating composite multi-spectral images based on pixel-level spectral intensity values; and employing generative Bayesian inference techniques that match the composite estimated growth curves to corresponding known crop vegetation index double-sigmoid functions to estimate first associated posterior distribution parameters; providing a time series of second remote sense images associated with a corresponding field having unknown management practices as exclusive inputs to the Bayesian crop model; and executing the Bayesian crop model to predict a crop type, a planting date, an emergence date, a senescence start date, and a harvest date for the corresponding field, the executing comprising: treating the estimated first associated posterior distribution parameters as known quantities; and using the known quantities to generate the crop type, the planting date, the emergence date, the senescence start date, and the harvest date from estimated second associated posterior distribution parameters derived from the time series of second remote sense images.

2. The computer-implemented method as recited in claim 1, wherein replacement of the second missing data employs extrapolated data generated from time-processing of the third data from the other time-adjacent images.

3. The computer-implemented method as recited in claim 2, wherein the Bayesian crop model approximates a posterior distribution of parameters of the double-sigmoid function given a set of observations corresponding to the second remote sense images using a Hamiltonian Monte Carlo algorithm to generate samples of the posterior distribution.

4. The computer-implemented method as recited in claim 1, wherein the geographic region comprises the United States Corn Belt.

5. The computer-implemented method as recited in claim 1, wherein the geographic region comprises a state within the United States.

6. The computer-implemented method as recited in claim 1, wherein the crop type, the planting date, the emergence date, the senescence start date, and the harvest date are employed to prepopulate an enrollment application for participation of the field in a grower incentive program.

7. The computer-implemented method as recited in claim 1, wherein the crop type, the planting date, the emergence date, the senescence start date, and the harvest date are employed to verify implementation of incentive program management practices corresponding to participation of the field a grower incentive program.

8. A non-transitory computer-readable storage medium storing instructions that, when executed by a computer, cause the computer to perform a method for predicting agricultural management practices, the method comprising:

generating a training dataset that comprises a plurality of years of known management practices associated with a plurality of fields dispersed within geographic region along with a corresponding plurality of years of first remote sense images;

training a Bayesian crop model to predict the plurality of years of known management practices associated with the plurality of fields using the corresponding plurality of years of first remote sense images as inputs, the training comprising cleansing the corresponding plurality of years of remote sense images by:

removing images with first missing data below a prescribed threshold;

retaining images with second missing data above the prescribed threshold;

time-processing third data from other time-adjacent images that corresponds to the second missing data; and using the time-processed third data to replace the second missing data;

combining spectral band images for each observation date to generate corresponding first composite images combining first composite images for each observation date to create composite estimated growth curves for each of the plurality of fields;

wherein the time-processing of the third data comprises generating reconstructed spectral values for missing portions of the remote sense images using temporally adjacent remote sensing images, and wherein combining the spectral band images comprises generating composite multi-spectral images based on pixel-level spectral intensity values; and employing generative Bayesian inference techniques that match the composite estimated growth curves to corresponding known crop vegetation index double-sigmoid functions to estimate first associated posterior distribution parameters;

providing a time series of second remote sense images associated with a corresponding field having unknown management practices as exclusive inputs to the Bayesian crop model; and executing the Bayesian crop model to predict a crop type, a planting date, an emergence date, a senescence start date, and a harvest date for the corresponding field, the executing comprising:

treating the estimated first associated posterior distribution parameters as known quantities; and using the known quantities to generate the crop type, the planting date, the emergence date, the senescence start date, and the harvest date from estimated second associated posterior distribution parameters derived from the time series of second remote sense images.

9. The computer-implemented method as recited in claim 8, wherein replacement of the second missing data employs extrapolated data generated from time-processing of the third data from the other time-adjacent images.

10. The computer-implemented method as recited in claim 9, wherein the Bayesian crop model approximates a posterior distribution of parameters of the double-sigmoid function given a set of observations corresponding to the second remote sense images using a Hamiltonian Monte Carlo algorithm to generate samples of the posterior distribution.

11. The computer-implemented method as recited in claim 8, wherein the geographic region comprises the United States Corn Belt.

12. The computer-implemented method as recited in claim 8, wherein the geographic region comprises a state within the United States.

13. The computer-implemented method as recited in claim 8, wherein crop type, the planting date, the emergence date, the senescence start date, and the harvest date are employed to prepopulate an enrollment application for participation of the field in a grower incentive program.

14. The computer-implemented method as recited in claim 8, wherein the crop type, the planting date, the emergence date, the senescence start date, and the harvest date are employed to verify implementation of incentive program management practices corresponding to participation of the field a grower incentive program.

15. A system for predicting agricultural management practices, the system comprising:

an incentive program server, the server comprising:

a crop model processor, comprising a Bayesian crop model; and a training processor, configured to:

generate a training dataset that comprises a plurality of years of known management practices associated with a plurality of fields dispersed within geographic region along with a corresponding plurality of years of first remote sense images; and train the Bayesian crop model to predict the plurality of years of known management practices associated with the plurality of fields using the corresponding plurality of years of first remote sense images as inputs, wherein training the Bayesian crop model comprises:

cleansing the corresponding plurality of years of remote sense images by:

removing images with first missing data below a prescribed threshold;

retaining images with second missing data above the prescribed threshold;

time-processing third data from other time-adjacent images that corresponds to the second missing data; and using the time-processed third data to replace the second missing data;

combining spectral band images for each observation date to generate corresponding first composite images;

combining first composite images for each observation date to create composite estimated growth curves for each of the plurality of fields, wherein the time-processing of the third data comprises generating reconstructed spectral values for missing portions of the remote sense images using temporally adjacent remote sensing images, and wherein combining the spectral band images comprises generating composite multi-spectral images based on pixel-level spectral intensity values, and employing generative Bayesian inference techniques that match the composite estimated growth curves to corresponding known crop vegetation index double-sigmoid functions to estimate first associated posterior distribution parameters;

a remote sense processor, configured to provide a time series of second remote sense images associated with a corresponding field having unknown management practices as exclusive inputs to the Bayesian crop model within the crop model processor;

the crop model processor, configured to execute the Bayesian crop model to predict a crop type, a planting date, an emergence date, a senescence start date, and a harvest date for the corresponding field, wherein executing the Bayesian crop model comprises:

treating the estimated first associated posterior distribution parameters as known quantities; and using the known quantities to generate the crop type, the planting date, the emergence date, the senescence start date, and the harvest date from estimated second associated posterior distribution parameters derived from the time series of second remote sense images.

16. The system as recited in claim 15, wherein replacement of the second missing data employs extrapolated data generated from time-processing of the third data from the other time-adjacent images.

17. The system as recited in claim 16, wherein the Bayesian crop model approximates a posterior distribution of parameters of the double-sigmoid function given a set of observations corresponding to the second remote sense images using a Hamiltonian Monte Carlo algorithm to generate samples of the posterior distribution.

18. The system as recited in claim 15, wherein the geographic region comprises the United States Corn Belt.

19. The system as recited in claim 15, wherein the crop type, the planting date, the emergence date, the senescence start date, and the harvest date are employed to prepopulate an enrollment application for participation of the field in a grower incentive program.

20. The system as recited in claim 15, wherein the crop type, the planting date, the emergence date, the senescence start date, and the harvest date are employed to verify implementation of incentive program management practices corresponding to participation of the field a grower incentive program.

* * * * *